(12) United States Patent
Skamser et al.

(10) Patent No.: US 11,650,498 B2
(45) Date of Patent: May 16, 2023

(54) PRINTABLE COMPOSITIONS INCLUDING HIGHLY VISCOUS COMPONENTS AND METHODS OF CREATING 3D ARTICLES THEREFROM

(71) Applicant: 3M INNOVATIVE PROPERTIES COMPANY, St. Paul, MN (US)

(72) Inventors: Daniel J. Skamser, Ham Lake, MN (US); Carsten Franke, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 960 days.

(21) Appl. No.: 16/309,533

(22) PCT Filed: Jun. 27, 2017

(86) PCT No.: PCT/US2017/039515
§ 371 (c)(1),
(2) Date: Dec. 13, 2018

(87) PCT Pub. No.: WO2018/005501
PCT Pub. Date: Jan. 4, 2018

(65) Prior Publication Data
US 2019/0163060 A1    May 30, 2019

Related U.S. Application Data

(60) Provisional application No. 62/356,871, filed on Jun. 30, 2016.

(51) Int. Cl.
*B33Y 70/00* (2020.01)
*B33Y 10/00* (2015.01)
(Continued)

(52) U.S. Cl.
CPC .............. *G03F 7/031* (2013.01); *B33Y 70/00* (2014.12); *G03F 7/0037* (2013.01);
(Continued)

(58) Field of Classification Search
None
See application file for complete search history.

(56) References Cited

U.S. PATENT DOCUMENTS 4,642,126 A    2/1987    Zador
4,652,274 A    3/1987    Boettcher
(Continued)

FOREIGN PATENT DOCUMENTS

CN    1637595    7/2005
CN    1662621    8/2005
(Continued)

OTHER PUBLICATIONS

Surfaces, Chemistry & Applications; https://www.sciencedirect.com/topics/engineering/solvent-viscosity#:~:text=Solvent%20viscosity%20of%20resins%20is,concentration%2C%20the%20higher%20the%20viscosity. (Year: 2002).*

(Continued)

*Primary Examiner* — Timothy Kennedy
*Assistant Examiner* — Farah Taufiq
(74) *Attorney, Agent, or Firm* — Adrian L. Pishko; Melissa E. Buss

(57) ABSTRACT

The present disclosure provides a method for building a three-dimensional object using a printable composition including high viscosity polymerizable components. The method includes the steps of a) providing a printable composition comprising a high viscosity polymerizable component and a temporary solvent; b) selectively curing the printable composition to form an article representing the shape of the three-dimensional object; and c) removing a (Continued)

substantial amount of the temporary solvent from the article. The method is particularly well suited to making an orthodontic clear tray aligner. Also disclosed are a variety of printable compositions including high viscosity polymerizable components, such as polyurethane methacrylates, and temporary solvents.

9 Claims, 4 Drawing Sheets

(51) Int. Cl.
    *G03F 7/031* (2006.01)
    *G03F 7/00* (2006.01)
    *G03F 7/004* (2006.01)
    *G03F 7/027* (2006.01)

(52) U.S. Cl.
    CPC .......... *G03F 7/0045* (2013.01); *G03F 7/0048* (2013.01); *G03F 7/027* (2013.01); *B33Y 10/00* (2014.12)

(56) References Cited

U.S. PATENT DOCUMENTS

| | | | |
|---|---|---|---|
| 5,639,413 A | 6/1997 | Crivello | |
| 5,972,563 A | 10/1999 | Steinmann | |
| 5,980,813 A | 11/1999 | Narang | |
| 5,981,621 A | 11/1999 | Clark | |
| 6,183,593 B1 | 2/2001 | Narang | |
| 6,322,728 B1 | 11/2001 | Brodkin | |
| 6,730,156 B1 | 5/2004 | Windisch | |
| 6,739,870 B2 | 5/2004 | Lai | |
| 6,808,659 B2 | 10/2004 | Schulman | |
| 6,821,462 B2 | 11/2004 | Schulman | |
| 6,899,948 B2 | 5/2005 | Zhang | |
| 6,994,549 B2 | 2/2006 | Brodkin | |
| 7,134,874 B2 | 11/2006 | Chisti | |
| 7,435,083 B2 | 10/2008 | Chisti | |
| 7,563,397 B2 | 7/2009 | Schulman | |
| 7,632,621 B2 | 12/2009 | Anzures | |
| 8,227,048 B2 | 7/2012 | Leyden | |
| 8,329,776 B2 | 12/2012 | Hecht | |
| 8,334,025 B2 | 12/2012 | Fong | |
| 8,389,599 B2 | 3/2013 | Yang | |
| 8,501,033 B2 | 8/2013 | Southwell | |
| 8,535,580 B2 | 9/2013 | Puttler | |
| 9,157,007 B2 | 10/2015 | Xu | |
| 9,295,617 B2 | 3/2016 | Eckert | |
| 10,125,264 B2 | 11/2018 | Ganapathiappan et al. | |
| 2002/0033548 A1 | 3/2002 | Brodkin | |
| 2002/0064745 A1 | 5/2002 | Schulman | |
| 2002/0125592 A1 | 9/2002 | Schulman | |
| 2002/0195746 A1* | 12/2002 | Hull ..................... B29C 64/124 | |
| | | | 425/375 |
| 2002/0195747 A1 | 12/2002 | Hull | |
| 2004/0170923 A1 | 9/2004 | Steinmann | |
| 2004/0262797 A1 | 12/2004 | Schulman | |
| 2005/0072519 A1 | 4/2005 | Johnson | |
| 2005/0110177 A1 | 5/2005 | Schulman | |
| 2005/0170309 A1 | 8/2005 | Raby | |
| 2005/0209360 A1 | 9/2005 | Graichen | |
| 2005/0218549 A1 | 10/2005 | Farr et al. | |
| 2006/0073435 A1 | 4/2006 | Stark | |
| 2006/0073436 A1 | 4/2006 | Raby | |
| 2006/0105286 A1 | 5/2006 | Raby | |
| 2007/0031791 A1 | 2/2007 | Cinader, Jr. | |
| 2007/0116311 A1 | 5/2007 | Litke | |
| 2008/0233531 A1 | 9/2008 | Raby | |
| 2008/0248442 A1 | 10/2008 | Raby | |
| 2009/0286296 A1 | 11/2009 | Hickey | |
| 2010/0219546 A1 | 9/2010 | Puttler | |
| 2010/0260405 A1 | 10/2010 | Cinader, Jr. | |
| 2011/0091832 A1 | 4/2011 | Kim | |
| 2011/0104500 A1 | 5/2011 | Southwell | |
| 2012/0061868 A1 | 3/2012 | Christoff | |
| 2012/0231232 A1 | 9/2012 | Xu | |
| 2013/0095446 A1 | 4/2013 | Andreiko | |
| 2013/0122448 A1 | 5/2013 | Kitching | |
| 2013/0234370 A1 | 9/2013 | Suzuki | |
| 2014/0017460 A1* | 1/2014 | Xu ..................... C08G 18/672 | |
| | | | 428/201 |
| 2014/0035202 A1 | 2/2014 | Southwell | |
| 2014/0131908 A1 | 5/2014 | Sun | |
| 2014/0239527 A1 | 8/2014 | Lee | |
| 2014/0315153 A1 | 10/2014 | Kitching | |
| 2014/0356799 A1 | 12/2014 | Cinader, Jr. | |
| 2015/0044623 A1 | 2/2015 | Rundlett | |
| 2015/0375454 A1 | 12/2015 | Xu | |
| 2016/0068696 A1 | 3/2016 | Xu | |
| 2016/0137839 A1 | 5/2016 | Rolland | |
| 2016/0263826 A1 | 9/2016 | Suzuki | |
| 2016/0264796 A1 | 9/2016 | Suzuki | |
| 2018/0142108 A1* | 5/2018 | Lewis ..................... C08J 9/008 | |
| 2019/0054666 A1* | 2/2019 | Shpiro ................ B29C 35/0266 | |

FOREIGN PATENT DOCUMENTS

| | | |
|---|---|---|
| CN | 101263428 | 9/2008 |
| CN | 105164210 | 12/2015 |
| CN | 105164210 A | 12/2015 |
| EP | 2008636 | 12/2008 |
| EP | 1788009 | 3/2010 |
| EP | 2842980 | 3/2015 |
| EP | 2683774 | 8/2018 |
| JP | H9-241311 A2 | 9/1997 |
| JP | 2003-53847 | 2/2003 |
| JP | 2003-053847 A2 | 2/2003 |
| JP | 2005-526896 T2 | 9/2005 |
| JP | 2007-035405 | 2/2007 |
| JP | 2008-534256 T2 | 8/2008 |
| JP | 2015-221566 | 12/2015 |
| JP | 2015-221566 A | 12/2015 |
| RU | 2244335 | 1/2005 |
| RU | 2395827 | 7/2010 |
| RU | 2408627 | 1/2011 |
| WO | WO 1996-030182 | 10/1996 |
| WO | WO 1998-006560 | 2/1998 |
| WO | 2003-099947 A1 | 12/2003 |
| WO | WO 2004-077157 | 9/2004 |
| WO | 2006-101386 A1 | 9/2006 |
| WO | WO 2007-084727 | 7/2007 |
| WO | WO 2009-006282 | 1/2009 |
| WO | WO 2009-042378 | 4/2009 |
| WO | WO 2009-045752 | 4/2009 |
| WO | WO 2009-070500 | 6/2009 |
| WO | WO 2010-104603 | 9/2010 |
| WO | WO 2012-121884 | 9/2012 |
| WO | WO 2014-078537 | 5/2014 |
| WO | WO 2014-172716 | 10/2014 |
| WO | WO 2014-204450 | 12/2014 |
| WO | WO 2015-094842 | 6/2015 |
| WO | WO 2016-039986 | 3/2016 |
| WO | WO 2016-071811 | 5/2016 |
| WO | WO 2016-109660 | 7/2016 |
| WO | WO 2016-148960 | 9/2016 |
| WO | WO 2016-149007 | 9/2016 |
| WO | WO 2017-127561 | 7/2017 |
| WO | WO 2018-119026 | 6/2018 |
| WO | WO 2019-023009 | 1/2019 |

OTHER PUBLICATIONS

International Search Report for PCT International Application No. PCT/US2017/039515, dated Oct. 11, 2017, 5 pages.
PCT/US2018/060014, filed on Nov. 9, 2018, 72 pages.
Functional oligomers (CN series), URL, https://www.tomo-e.co.jp/upload/cProductsJA/25QU044-cProductsJA_content-015.pdf, retrieved from the internet on Jun. 8, 2021.

* cited by examiner

PRINTABLE COMPOSITIONS INCLUDING HIGHLY VISCOUS COMPONENTS AND METHODS OF CREATING 3D ARTICLES THEREFROM

SUMMARY OF THE INVENTION

The use of stereolithography and inkjet printing to produce three-dimensional articles has been known for a relatively long time, and these processes are generally known as methods of so called 3D printing. In stereolithography techniques the desired 3D article is built up from a liquid, curable composition with the aid of a recurring, alternating sequence of two steps: in the first step, a layer of the liquid, curable composition, one boundary of which is the surface of the composition, is cured with the aid of appropriate radiation within a surface region which corresponds to the desired cross-sectional area of the shaped article to be formed, at the height of this layer, and in the second step, the cured layer is covered with a new layer of the liquid, curable composition, and the sequence of steps is repeated until a so-called green body of the desired shape is finished. This green body is, in general, not yet fully cured and must, normally, be subjected to post-curing. The mechanical strength of the green body immediately after curing, otherwise known as green strength, is relevant to further processing of the printed articles.

Other 3D printing techniques use inks that are jetted through a print head as a liquid to form various three-dimensional articles. In operation, the print head may deposit curable photopolymers in a layer-by-layer fashion. Some jet printers deposit a polymer in conjunction with a support material or a bonding agent. In some instances, the build material is solid at ambient temperatures and converts to liquid at elevated jetting temperatures. In other instances, the build material is liquid at ambient temperatures.

One particularly attractive opportunity for 3D printing is in the direct creation of orthodontic clear tray aligners. These trays, also known as aligners and polymeric or shell appliances, are provided in a series and are intended to be worn in succession in order to gradually move the teeth in incremental steps toward a desired target arrangement. Some types of clear tray aligners have a row of tooth-shaped receptacles for receiving each tooth of the patient's dental arch, and the receptacles are oriented in slightly different positions from one appliance to the next in order to incrementally urge each tooth toward its desired target position by virtue of the resilient properties of the polymeric material. A variety of methods have been proposed in the past for manufacturing clear tray aligners and other resilient appliances. Typically positive dental arch models are fabricated for each dental arch using additive manufacturing methods such as stereolithography described above. Subsequently, a sheet of polymeric material is placed over each of the arch models and formed under heat, pressure and/or vacuum to conform to the model teeth of each model arch. The formed sheet is cleaned and trimmed as needed and the resulting arch-shaped appliance is shipped along with the desired number of other appliances to the treating professional.

An aligner or other resilient appliance created directly by 3D printing would eliminate the need to print a mold of the dental arch and further thermoform the appliance. It also would allow new aligner designs and give more degrees of freedom in the treatment plan. Exemplary methods of direct printing clear tray aligners and other resilient orthodontic apparatuses are set forth in International Application Nos. PCT/US2015/068054 (Raby et al.), PCT/US2016/021239 (Cinader et al.),) PCT/US2016/021583 (Cinader et al.), as well as US Publication Nos. 2011/0091832 (Kim, et al.) and US2013/0095446 (Kitching).

Existing printable resins, however, are too brittle (i.e., low elongation, short-chain crosslinked bonding, thermoset composition, high glass transition temperature) for a resilient oral appliance such as an aligner. An aligner or other appliance printed from such resins could easily break in the patient's mouth during treatment, creating material fragments that may abrade or puncture exposed tissue or be swallowed. These fractures at the very least interrupt treatment and could have serious health consequences for the patient. While the brittle nature of the existing resins might be rectified by using polymerizable components in the printable resin with less crosslinking and higher elongation (e.g., hydroxyethyl methacrylate), such resins are prone to loose strength when immersed in water; a problem exacerbated by a moisture rich environment such as a human mouth.

Thus, there is a need for curable liquid resin compositions that are tailored and well suited for creation of resilient appliances using a 3D printing method. Preferably, curable liquid resin compositions to be used in the 3D printing process have low viscosity, a proper curing rate, and excellent mechanical properties in both the green body and the final cured article.

The present disclosure provides printable compositions including a high viscosity polymerizable component that is not otherwise amenable to serving as the primary polymerizable component in 3D printing processes, particularly stereolithography. A resin with high viscosity will typically, for example, make the recoating step of the stereolithography process more difficult and time consuming. Moreover, a cured three-dimensional article made with a high viscosity curable resin can be more difficult to clean from "green" parts after the stereolithography process is complete. In addition, the use of high temperatures to lower the viscosity of the resin is not generally amenable to the 3D printing process due to limitations of the 3D printing equipment or poor process control. By admixing the high viscosity resin with elevated levels of a temporary and removable solvent, the material properties of the polymerizable component can be retained in a cured article without sacrificing the printability of the resin. Moreover, articles fabricated from the printable compositions of the present disclosure do not appreciably swell in presence of water or salvia. The printable compositions of the present disclosure are accordingly particularly useful for making resilient oral care appliances, including clear tray aligners.

In one aspect, the present disclosure provides a method for building a three-dimensional object, the method comprising a) providing a printable composition comprising a high viscosity polymerizable component, a temporary solvent, and an initiator; b) selectively curing the printable composition to form an article representing the shape of the three-dimensional object; c) removing a substantial amount of the temporary solvent from the article; and d) optionally curing unpolymerized polymerizable component remaining before or after step c).

In another aspect, the present disclosure provides a printable composition useful for additive manufacturing, the composition comprising (a) 45-95 wt. % polymerizable component having a viscosity of at least 20,000 cP at 25° C.; (b) 5-50 wt. % temporary solvent; (c) 0.1-5 wt. % photoinitiator; (d) 0.001-1 wt. % inhibitor; and optionally e) 0.01-1 wt. % absorption modifier, based on the total weight of the composition.

In another aspect, the present disclosure provides a stereolithography apparatus comprising a vat; and a printable composition within the vat, wherein the printable composition comprises (a) 45-95 wt. % polymerizable component having a viscosity of at least 20,000 cP at 25° C.; (b) 5-50 wt. % temporary solvent; (c) 0.1-5 wt. % photoinitiator; (d) 0.001-1 wt. % inhibitor; and optionally e) 0.01-1 wt. % absorption modifier, based on the total weight of the composition.

As used herein, the terms "hardenable" refers to a material that can be cured or solidified, e.g., by heating to remove solvent, heating to cause polymerization, chemical cross-linking, radiation-induced polymerization or crosslinking, or the like.

As used herein, "curing" means the hardening or partial hardening of a composition by any mechanism, e.g., by heat, light, radiation, e-beam, microwave, chemical reaction, or combinations thereof.

As used herein, "cured" refers to a material or composition that has been hardened or partially hardened (e.g., polymerized or crosslinked) by curing.

As used herein, the term "(meth)acrylate" is a shorthand reference to acrylate, methacrylate, or combinations thereof, and "(meth)acrylic" is a shorthand reference to acrylic, methacrylic, or combinations thereof. As used herein, "(meth)acrylate-functional compounds" are compounds that include, among other things, a (meth)acrylate moiety.

As used herein, "printable", means that a hardenable composition, prior to polymerization (i.e., hardening), has a viscosity profile consistent with the requirements and parameters of one or more 3D printing systems, including for example vat polymerization processes such as stereolithography (SLA), and inkjet 3D printing As used herein, "print" and "printing" are meant in the context of 3D printing which includes vat polymerization (such as stereolithography and digital light processing), and inkjet 3D printing; a process in which a three dimensional article is built up from a liquid, curable composition.

As used herein, a "resin" contains all polymerizable components (monomers, oligomers and/or polymers) being present in a hardenable, printable composition. The resin may contain only one polymerizable component compound or a mixture of different polymerizable compounds.

As used herein, "mesial" means in a direction toward the center of the patient's curved dental arch; 'distal" means in a direction away from the center of the patient's curved dental arch; "occlusal" means in a direction toward the outer tips of the patient's teeth; "gingival" means in a direction toward the patient's gums or gingiva; "facial" means in a direction toward the patient's lips or cheeks; and "lingual" means in a direction toward the patient's tongue.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure.

In this application, terms such as "a", "an", and "the" are not intended to refer to only a singular entity, but include the general class of which a specific example may be used for illustration. The terms "a", "an", and "the" are used interchangeably with the term "at least one." The phrases "at least one of" and "comprises at least one of" followed by a list refers to any one of the items in the list and any combination of two or more items in the list.

As used herein, the term "or" is generally employed in its usual sense including "and/or" unless the content clearly dictates otherwise.

The term "and/or" means one or all of the listed elements or a combination of any two or more of the listed elements.

Also herein, all numbers are assumed to be modified by the term "about" and preferably by the term "exactly." As used herein in connection with a measured quantity, the term "about" refers to that variation in the measured quantity as would be expected by the skilled artisan making the measurement and exercising a level of care commensurate with the objective of the measurement and the precision of the measuring equipment used.

Also herein, the recitations of numerical ranges by endpoints include all numbers subsumed within that range as well as the endpoints (e.g., 1 to 5 includes 1, 1.5, 2, 2.75, 3, 3.80, 4, 5, etc.).

As used herein as a modifier to a property or attribute, the term "generally", unless otherwise specifically defined, means that the property or attribute would be readily recognizable by a person of ordinary skill but without requiring absolute precision or a perfect match (e.g., within +/−20% for quantifiable properties). The term "substantially", unless otherwise specifically defined, means to a high degree of approximation (e.g., within +/−10% for quantifiable properties) but again without requiring absolute precision or a perfect match. Terms such as same, equal, uniform, constant, strictly, and the like, are understood to be within the usual tolerances or measuring error applicable to the particular circumstance rather than requiring absolute precision or a perfect match.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

Figure 1:
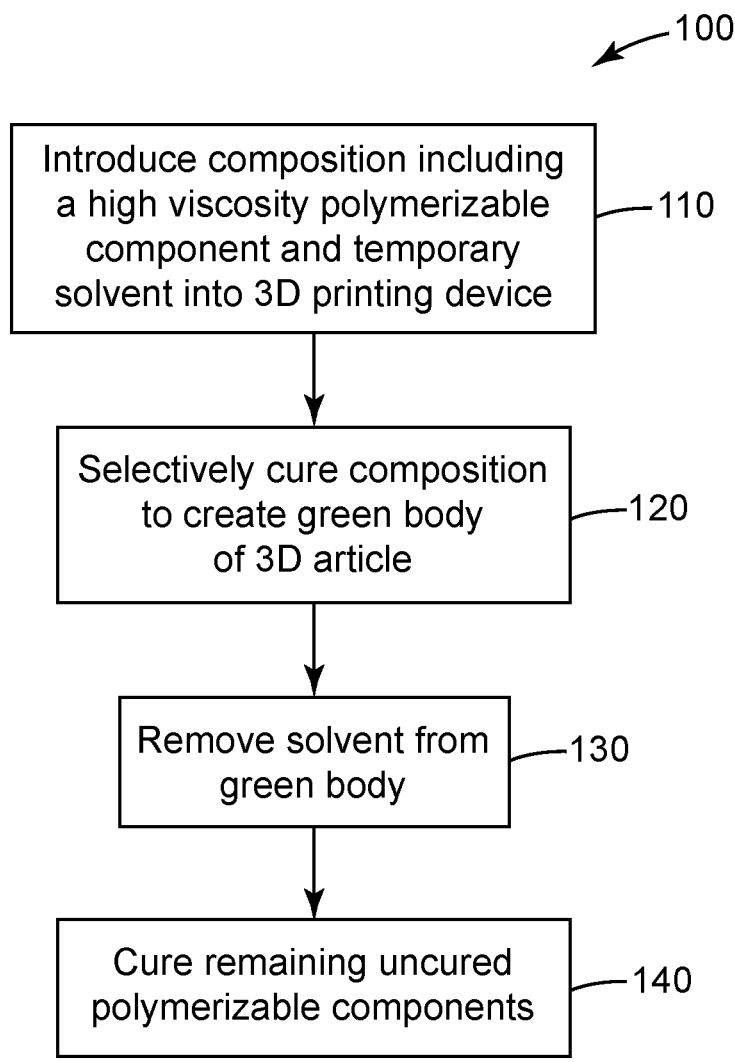
FIG. 1 is a flowchart of a process for building an article using the printable compositions disclosed herein

While the above-identified figures set forth several embodiments of the disclosure other embodiments are also contemplated, as noted in the description. In all cases, this disclosure presents the invention by way of representation and not limitation. It should be understood that numerous other modifications and embodiments can be devised by those skilled in the art, which fall within the scope and spirit of the principles of the invention.

DETAILED DESCRIPTION OF ILLUSTRATIVE EMBODIMENTS

The printable compositions of the present disclosure include a high viscosity polymerizable component that is typically found in much lesser concentrations in the primary polymerizable component in commonly used 3D printing techniques. By admixing the high viscosity polymerizable resin with elevated levels of a temporary and removable solvent, the desirable material properties of the high viscosity polymerizable component can be retained in a cured body without sacrificing the printability of the resin.

The present disclosure provides a hardenable, printable composition typically comprising (a) 45-95 wt. % polymerizable component; (b) 5-50 wt. % temporary solvent; (c) 0.1-5 wt. % photoinitiator; (d) 0.001-1 wt. % inhibitor; and optionally e) 0.01-1 wt. % absorption modifier, based on the total weight of the composition.

Polymerizable Component

The printable compositions of the present disclosure include at least one polymerizable component. A "polymerizable component," for reference purposes herein, comprises a hardenable component that can be cured to provide a printed 3D article. In some embodiments, for instance, hardening comprises irradiating with electromagnetic radiation having sufficient energy to initiate a polymerization or cross-linking reaction. For instance, in some embodiments, ultraviolet (UV) radiation can be used.

Suitable polymerizable components contain at least one ethylenically unsaturated bond, and are capable of undergoing addition polymerization. Such free-radically polymerizable materials include mono-, di- or poly-acrylates and methacrylates such as methyl acrylate, methyl methacrylate, ethyl acrylate, isopropyl methacrylate, n-hexyl acrylate, stearyl acrylate, allyl acrylate, glycerol diacrylate, the diurethane dimethacrylate called UDMA (mixture of isomers, e.g., Röhm Plex 6661-0) being the reaction product of 2-hydroxyethyl methacrylate (HEMA) and 2,2,4-trimethylhexamethylene diisocyanate (TMDI), glycerol triacrylate, ethyleneglycol diacrylate, diethyleneglycol diacrylate, triethyleneglycol dimethacrylate, 1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyldimethylmethane, bis[1-(3-acryloxy-2-hydroxy)]-p-propoxyphenyldimethylmethane, and trishydroxyethylisocyanurate trimethacrylate; the bis-acrylates and bis-methacrylates of polyethylene glycols of molecular weight 200-500, copolymerizable mixtures of acrylated monomers such as those in U.S. Pat. No. 4,652,274 (Boettcher et al.), and acrylated oligomers such as those of U.S. Pat. No. 4,642,126 (Zador et al.); and vinyl compounds such as styrene, diallyl phthalate, divinyl succinate, divinyl adipate and divinylphthalate; polyfunctional (meth)acrylates comprising urethane, urea or amide groups, as those of EP2008636 (Hecht et al.). The polymerizable component also may comprise silicone acrylate oligomers, epoxy (meth)acrylate oligomers, polyester (meth)acrylate oligomers or chlorinated polyester (meth)acrylates, allylic oligomers and (meth)acrylic oligomers. Mixtures of two or more of these free radically polymerizable materials can be used if desired. The polymerizable component preferably comprises one or more poly(meth)acrylates, for example, di-, tri-, tetra- or pentafunctional monomeric or oligomeric aliphatic, cycloaliphatic or aromatic acrylates or methacrylates. The polymerizable component, in presently preferred implementations, includes a high viscosity poly(meth)acrylate. The preferred poly(meth)acrylates for use in the printable composition are not flowable at room temperature, having viscosities of over 20,000 cP at 25° C. As used herein "flowable" means that the polymerizable component deforms or flows under its own weight at room temperatures (e.g., 20-25° C.). In some embodiments described herein, a urethane (meth)acrylate or other poly(meth)acrylate has a viscosity ranging from about 20,000 cP to 300,000 cP at about 25° C. when measured in a manner consistent with ASTM D4287, as set forth in the Examples below.

For example, the polymerizable component can include polyfunctional urethane acrylates or urethane methacrylates. These urethane (meth)acrylates are known to the person skilled in the art and can be prepared in a known manner by, for example, reacting a hydroxyl-terminated polyurethane with acrylic acid or methacrylic acid, or by reacting an isocyanate-terminated prepolymer with hydroxyalkyl (meth)acrylates to give the urethane (meth)acrylate. Suitable processes are disclosed, inter alia, in U.S. Pat. No. 8,329,776 (Hecht et al.) and U.S. Pat. No. 9,295,617 (Cub et al.). Suitable urethante methacrylates can include PEGDMA (polyethyleneglycol dimethacrylate having a molecular weight of approximately 400), aliphatic urethane methacrylates, aliphatic polyester urethane methacrylates, aliphatic polyester triurethane acrylates.

Examples of suitable aliphatic poly(meth)acrylates having more than two (meth)acrylate groups in their molecules are the triacrylates and trimethacrylates of hexane-2,4,6-triol; glycerol or 1,1,1-trimethylolpropane; ethoxylated or propoxylated glycerol or 1,1,1-trimethylolpropane; and the hydroxyl-containing tri(meth)acrylates which are obtained by reacting triepoxide compounds, for example the triglycidyl ethers of said triols, with (meth)acrylic acid. It is also possible to use, for example, pentaerythritol tetraacrylate, bistrimethylolpropane tetraacrylate, pentaerythritol monohydroxytriacrylate or -methacrylate, or dipentaerythritol monohydroxypentaacrylate or -methacrylate.

Another suitable class of free radical polymerizable compounds includes aromatic di(meth) acrylate compounds and trifunctional or higher functionality (meth) acrylate compound. Trifunctional or higher functionality meth(acrylates) can be tri-, tetra- or pentafunctional monomeric or oligomeric aliphatic, cycloaliphatic or aromatic acrylates or methacrylates.

Examples of suitable aliphatic tri-, tetra- and pentafunctional (meth)acrylates are the triacrylates and trimethacrylates of hexane-2,4,6-triol; glycerol or 1,1,1-trimethylolpropane; ethoxylated or propoxylated glycerol or 1,1,1-trimethylolpropane; and the hydroxyl-containing tri(meth) acrylates which are obtained by reacting triepoxide compounds, for example the triglycidyl ethers of said triols, with (meth)acrylic acid. It is also possible to use, for example, pentaecryiuritol tetraacrylate, bistrimethylolpropane tetraacrylate, pentaerythritol monohydroxytriacrylate or -methacrylate, or dipentaerythritol monohydroxypentaacrylate or -methacrylate. In some embodiments, tri(meth)acrylates comprise 1,1-trimethylolpropane triacrylate or methacrylate, ethoxylated or propoxylated 1,1,1-trimethylolpropanetriacrylate or methacrylate, ethoxylated or propoxylated glycerol triacrylate, pentaerythritol monohydroxy triacrylate or methacrylate, or tris(2-hydroxy ethyl) isocyanurate triacrylate.

Further examples of suitable aromatic tri(meth)acrylates are the reaction products of triglycidyl ethers of trihydroxy benzene and phenol or cresol novolaks containing three hydroxyl groups, with (meth)acrylic acid.

In some cases, a polymerizable component comprises diacrylate and/or dimethacrylate esters of aliphatic, cycloaliphatic or aromatic diols, including 1,3- or 1,4-butanediol, neopentyl glycol, 1,6-hexanediol, diethylene glycol, triethylene glycol, tetraethylene glycol, polyethylene glycol, tripropylene glycol, ethoxylated or propoxylated neopentyl glycol, 1,4-dihydroxymethylcyclohexane, 2,2-bis(4-hydroxycyclohexyl)propane or bis(4-hydroxycyclohexyl) methane, hydroquinone, 4,4'-dihydroxybiphenyl, bisphenol A, bisphenol F, bisphenol S, ethoxylated or propoxylated bisphenol A, ethoxylated or propoxylated bisphenol F or ethoxylated or propoxylated bisphenol S.

In some cases, a polymerizable component of a printable described herein comprises one or more higher functional acrylates or methacrylates such as dipentaerythritol monohydroxy pentaacrylate or bis(trimethylolpropane)tetraacrylate.

One particularly suitable higher functional (meth)acrylate compound is Exothane 108, which is a difunctional urethane acrylate available from Esschem Europe LTD, Seaham, UK with a viscosity of 38,000 cP. Another suitable higher functional (meth)acrylate compound is Exothane 10 with a viscosity of 70,000 cP. Another suitable higher functional acrylate compound is CN9005, an aliphatic urethane oligomer, available from Sartomer Arkema, Exton, Pa., with a viscosity of 9,100 cP at 60° C. and 232,000 cP at 25° C. Another suitable higher functional acrylate compound is CN9009, an aliphatic urethane oligomer, available from Sartomer Arkema, Exton, Pa., with a viscosity of 3,000 cP at 60° C.

The poly(meth)acrylate polymerizable component is typically present in the printable composition in an amount of at least about 45 wt. %, at least about 50 wt. % or at least about 60 wt. % or at least about 70 wt. %, based on the total weight of the printable material composition.

The amount of poly(meth)acrylate polymerizable component is typically up to about 95 wt. % or up to about 90 wt. % or up to about 85 wt. %, based on the total weight of the composition.

Typically, the polymerizable component constitutes about 45% to about 95% by weight, more preferably, from about 60% to about 95% by weight of the total printable material composition.

Temporary Solvent

The viscosity of the polymerizable component can be significantly reduced by diluting the component in a non-reactive solvent. As used herein, a "non-reactive solvent" is a solvent that does not polymerize into the printable resin (e.g., the poly(meth)acrylate, initiator, and optionally other additives such as filler). As the solvent is non-reactive, it can be extracted from a printed article according to methods discussed below without deleteriously affecting the material properties of the, e.g., high viscosity polymerizable component resin. Accordingly, solvents useful in the present disclosure are referred to herein as temporary solvents.

The temporary solvent is typically an organic solvent having a boiling point of at least 50° C. The boiling point is often at least 100° C., at least 200° C., and typically no greater than 300° C. Suitable temporary solvent are typically non-volatile at ambient temperatures (20-25° C.) and have vapor pressures below about 150.0 hPa at 20° C. (preferably, below about 15.0 hPa at 20° C.; more preferably, below about 1.5 hPa at 20° C.; most preferably, below about 0.15 hPa at 20° C.). Temporary solvents demonstrating the above properties can typically be retained in the printable composition during the printing process even at elevated temperatures, yet be removed from the printed article using conventional techniques such as vacuum assisted evaporation.

In presently preferred implementations, the temporary solvent can include one or more of propylene carbonate, methanol, isopropyl alcohol, and tripropylene glycol methyl ether (TPM), and mixtures thereof. In presently preferred circumstances, the solvent is a propylene carbonate.

The temporary solvent is typically present in the printable composition in an amount of at least about 5 wt. %, at least about 10 wt. % or at least about 20 wt. %, based on the total weight of the printable composition.

The amount of temporary solvent is typically up to about 30 wt. %, up to 40 wt. %, or up to about 50 wt. %, based on the total weight of the composition.

Typically, the temporary solvent constitutes about 10% to about 40% by weight, more preferably, from about 15% to about 30% by weight of the total printable composition. Under certain conditions, a printable composition having less than 5-10 wt. % temporary solvent may not have a viscosity suitable for 3D printing, in that the viscosity of polymerizable component has not been adequately reduced. Conversely, a printable composition including more than 40-50 wt. % temporary solvent can, under certain conditions, result in green bodies with insufficient green strength and may result in difficulties in adequately removing the temporary solvent from the printed article.

Additives

Printable compositions described herein, in some instances, further comprise one or more additives, such as one or more additives selected from the group consisting of photoinitiators, inhibitors, stabilizing agents, sensitizers, absorption modifiers, fillers and combinations thereof. For example, in some embodiments, a printable composition further comprises one or more photoinitiators. Suitable exemplary photoinitiators are those available under the trade designations IRGACURE and DAROCUR from BASF (Ludwigshafen, Germany) and include 1-hydroxycyclohexyl phenyl ketone (IRGACURE 184), 2,2-dimethoxy-1, 2-diphenylethan-1-one (IRGACURE 651), bis(2,4,6 trimethylbenzoyl)phenylphosphineoxide (IRGACURE 819), 1-[4-(2-hydroxyethoxy)phenyl]-2-hydroxy-2-methyl-1-propane-1-one (IRGACURE 2959), 2-benzyl-2-dimethyl-amino-1-(4-morpholinophenyl)butanone (IRGACURE 369), 2-methyl-1-[4-(methylthio)phenyl]-2-morpholinopropan-1-one (IRGACURE 907), Oligo[2-hydroxy-2-methyl-1-[4-(1-methylvinyl)phenyl]propanone] ESACURE ONE (Lamberti S.p.A., Gallarate, Italy), 2-hydroxy-2-methyl-1-phenyl propan-1-one (DAROCUR 1173), 2, 4, 6-trimethyl-benzoyldiphenylphosphine oxide (IRGACURE TPO), and 2, 4, 6-trimethylbenzoylphenyl phosphinate (IRGACURE TPO-L). Additional suitable photoinitiators include for example and without limitation, benzyl dimethyl ketal, 2-methyl-2-hydroxypropiophenone, benzoin methyl ether, benzoin isopropyl ether, anisoin methyl ether, aromatic sulfonyl chlorides, photoactive oximes, and combinations thereof.

A photoinitiator can be present in a printable composition described herein in any amount according to the particular constraints of the 3D printer. In some embodiments, a photoinitiator is present in a printable composition in an amount of up to about 5% by weight, based on the total weight of the printable composition. In some cases, a photoinitiator is present in an amount of about 0.1-5% by weight, based on the total weigh to the printable composition.

In another embodiment of the present disclosure, the initiator system may optionally include thermal initiators to assist in curing of the printed green body. Suitable thermal initiators include organic peroxides (e.g., benzoyl peroxide), azo compounds, quinones, nitroso compounds, acyl halides, hydrazones, mercapto compounds, pyrylium compounds, imidazoles, chlorotriazines, benzoin, benzoin alkyl ethers, diketones, phenones, and mixtures thereof. Examples of suitable thermal initiators are VAZO 52, VAZO 64 and VAZO 67 azo compound thermal initiators, all available from DuPont. Particularly suitable thermal initiators include benzoyl peroxide, dicumylperoxide, and andazobisisobutyronitrile (AIBN). If used, a thermal initiator is present in an amount of about 0.01-2.5% by weight, based on the total weight of the composition. In certain implementations, a photoinitiator can also act as a thermal initiator at elevated temperatures.

In addition, a printable material composition described herein can further comprise one or more sensitizers to increase the effectiveness of one or more photoinitiators that may also be present. In some embodiments, a sensitizer comprises isopropylthioxanthone (ITX) or 2-chlorothioxanthone (CTX). Other sensitizers may also be used. If used in the printable composition, a sensitizer can be present in an amount ranging of about 0.01% by weight or about 1% by weight, based on the total weight of the printable composition.

A printable composition described herein can also comprise one or more polymerization inhibitors or stabilizing agents. A polymerization inhibitor can be added to a composition to provide additional thermal stability to the composition. A stabilizing agent, in some instances, comprises one or more anti-oxidants. Any anti-oxidant not inconsistent with the objectives of the present disclosure may be used. In some embodiments, for example, suitable anti-oxidants include various aryl compounds, including butylated hydroxytoluene (BHT), which can also be used as a polymerization inhibitor in embodiments described herein. In addition to or as an alternative, a polymerization inhibitor comprises methoxyhydroquinone (MEHQ).

In some embodiments, a polymerization inhibitor if used is present in an amount of about 0.001-2% by weight or 0.01-1% by weight, based on the total weight of the printable composition. Further, if used, a stabilizing agent is present in a printable composition described herein in an amount of about 0.1-5% by weight, about 0.5-4% by weight, or about 1-3% by weight, based on the total weight of the printable composition.

A printable composition as described herein can also comprise one or more absorption modifiers (e.g., dyes, optical brighteners, pigments, particulate fillers, etc.) to control the penetration depth of actinic radiation. One particularly suitable absorption modifier is Tinopal OB, a benzoxazole, 2,2'-(2,5-thiophenediyl)bis[5-(1,1-dimethylethyl)], available from BASF Corporation, Florham Park, N.J. The absorption modifier, if used, can be present in an amount of about 0.01-5% by weight, about 0.1-3% by weight, or about 0.1-1% by weight, based on the total weight of the printable composition.

Printable compositions may include fillers, including nano-scale fillers. Examples of suitable fillers are naturally occurring or synthetic materials including, but not limited to: quartz (i.e., silica, $SiO_2$); nitrides (e.g., silicon nitride); glasses and fillers derived from, for example, Zr, Sr, Ce, Sb, Sn, Ba, Zn, and Al; feldspar; borosilicate glass; kaolin (china clay); talc; zirconia; titania; and submicron silica particles (e.g., pyrogenic silicas such as those available under the trade designations AEROSIL, including "OX 50," "130," "150" and "200" silicas from Degussa Corp., Akron, Ohio and CAB-O-SIL M5 and TS-720 silica from Cabot Corp., Tuscola, Ill.). oRganic fillers made from polymeric materials are also possible, such as those disclosed in International Publication No. WO09/045752 (Kalgutkar et al.).

The compositions may further contain fibrous reinforcement and colorants such as dyes, pigments, and pigment dyes. Examples of suitable fibrous reinforcement include PGA microfibrils, collagen microfibrils, and others as described in U.S. Pat. No. 6,183,593 (Narang et al.). Examples of suitable colorants as described in U.S. Pat. No. 5,981,621 (Clark et al.) include 1-hydroxy-4-[4-methylphenylamino]-9,10-anthracenedione (FD&C violet No. 2); disodium salt of 6-hydroxy-5-[(4-sulfophenyl)oxo]-2-naphthalenesulfonic acid (FD&C Yellow No. 6); 9-(o-carboxyphenyl)-6-hydroxy-2,4,5,7-tetraiodo-3H-xanthen-3-one, disodium salt, monohydrate (FD&C Red No. 3); and the like.

Examples of useful pigments include, without limitation: white pigments, such as titanium oxide, zinc phosphate, zinc sulfide, zinc oxide and lithopone; red and red-orange pigments, such as iron oxide (maroon, red, light red), iron/chrome oxide, cadmium sulfoselenide and cadmium mercury (maroon, red, orange); ultramarine (blue, pink and violet), chrome-tin (pink) manganese (violet), cobalt (violet); orange, yellow and buff pigments such as barium titanate, cadmium sulfide (yellow), chrome (orange, yellow), molybdate (orange), zinc chromate (yellow), nickel titanate (yellow), iron oxide (yellow), nickel tungsten titanium, zinc ferrite and chrome titanate; brown pigments such as iron oxide (buff, brown), manganese/antimony/titanium oxide, manganese titanate, natural siennas (umbers), titanium tungsten manganese; blue-green pigments, such as chrome aluminate (blue), chrome cobalt-alumina (turquoise), iron blue (blue), manganese (blue), chrome and chrome oxide (green) and titanium green; as well as black pigments, such as iron oxide black and carbon black. Combinations of pigments are generally used to achieve the desired color tone in the cured composition.

The use of florescent dyes and pigments can also be beneficial in enabling the printed composition to be viewed under black-light. A particularly useful hydrocarbon soluble fluorescing dye is 2,5-bis(5-tert-butyl-2-benzoxazolyl) 1 thiophene. Fluorescing dyes, such as rhodamine, may also be bound to cationic polymers and incorporated as part of the resin.

If desired, the compositions of the disclosure may contain other additives such as indicators, accelerators, surfactants, wetting agents, antioxidants, tartaric acid, chelating agents, buffering agents, and other similar ingredients that will be apparent to those skilled in the art. Surfactants, for example, nonionic surfactants, cationic surfactants, anionic surfactants, and combinations thereof, may optionally be used in the compositions. Useful surfactants include non-polymerizable and polymerizable surfactants. Additionally, medicaments or other therapeutic substances can be optionally added to the printed compositions. Examples include, but are not limited to, fluoride sources, whitening agents, anti-caries agents (e.g., xylitol), remineralizing agents (e.g., calcium phosphate compounds and other calcium sources and phosphate sources), enzymes, wreath fresheners, anesthetics, clotting agents, acid neutralizers, chemotherapeutic agents, immune response modifiers, thixotropes, polyols, anti-inflammatory agents, antimicrobial agents, antifungal agents, agents for treating xerostomia, desensitizers, and the like, of the type often used in dental compositions.

Combination of any of the above additives may also be employed. The selection and amount of any one such additive can be selected by one of skill in the art to accomplish the desired result without undue experimentation.

Printable compositions materials herein can also exhibit a variety of desirable properties, non-cured, as green bodies, and as post-cured 3D articles. A printable composition, when non-cured, has a viscosity profile consistent with the requirements and parameters of one or more 3D printing systems. In some instances, a printable composition described herein when non-cured exhibits a dynamic viscosity of about 0.1-15,000 cP, about 100-5000 cP, or about 200-3000 cP at 25 deg. C., when measured according to ASTM D4287, as set forth in the Examples below. In some cases, a printable composition described herein when non-cured exhibits a dynamic viscosity of less than about 100 cP or more than about 1000 cP, when measured according to modified ASTM D4287. For certain inkjet printable compositions, the dynamic viscosity when non-cured can be between about 10 cP and about 30 cP at the jetting temperature.

In addition, a printable composition described herein can be fluid at jetting temperatures encountered in 3D printing systems. Moreover, in some embodiments, a printable composition solidifies once deposited on a surface during the fabrication of a three-dimensionally printed article or object. Alternatively, in other instances, a printable composition remains substantially fluid upon deposition on a surface. Solidification of a printable composition, in some embodiments, occurs through a phase change of the printable composition or a component of the printable composition. The phase change can comprise a liquid to solid phase change or a liquid to semi-solid phase change. Further, in some instances, solidification of a printable composition comprises an increase in viscosity of the printable composition, such as an increase in viscosity from a low viscosity state to a high viscosity state.

Further, a printable composition described herein in a cured state, in some embodiments, can exhibit one or more desired properties. A printable composition in a "cured" state can comprise a printable composition that includes a polymerizable component that has been at least partially polymerized and/or cross-linked. For instance, in some instances, a cured article is at least about 10% polymerized or cross-linked or at least about 30% polymerized or cross-linked. In some cases, a cured printable composition is at least about 50%, at least about 70%, at least about 80%, or at least about 90% polymerized or cross-linked. A cured printable composition can also be between about 10% and about 99% polymerized or cross-linked.

The conformability and durability of a cured article made from the printable compositions of the present disclosure can be determined in part by standard tensile and elongation testing. The printable compositions can typically be characterized by at least one of the following parameters after hardening. The elongation at break of the cured article can range from 80% to 600%. In some embodiments, the elongation at break is at least 100% and no greater than 500%. The ultimate tensile strength is typically at least 2, 3, or 4 MPa and is typically no greater than 80 MPa. The Young's elastic modulus is typically at least 3.0, 5.0, 7.0, or 8.0 MPa and is typically no greater than about 500 MPa. In some embodiments, the Young's elastic modulus of a cured article is at least 5.0 MPa and typically no greater than 350 MPa. Such tensile and elongation properties can be measured, for example, by the methods outlined in ASTM D638-10, using test specimen Type V.

The mechanical properties above are particularly well suited for articles that require resiliency and flexibility, along with adequate wear strength and low hygroscopicity.

Printable compositions described herein can be mixed by known techniques. In some embodiments, for instance, a method for the preparation of a printable composition described herein comprises the steps of mixing all or substantially all of the components of the printable composition, melting the mixture, and filtering the molten mixture. Melting the mixture, in some embodiments, is carried out at a temperature of about 50° C. or in a range from about 50° C. to about 85° C. In some embodiments, a printable composition described herein is produced by placing all or substantially all components of the composition in a reaction vessel and heating the resulting mixture to a temperature ranging from about 50° C. to about 85° C. with stirring. The heating and stirring are continued until the mixture attains a substantially homogenized molten state.

Fabricating an Article

Once prepared as set forth above, the printable compositions of the present disclosure may be used in myriad additive manufacturing processes to create a variety of articles. A generalized method 100 for creating three-dimensional articles is illustrated in FIG. 1. Each step in the method will be discussed in greater detail below. First, in Step 110 the desired printable composition is provided and introduced into a reservoir, cartridge, or other suitable container for use by or in a 3D printer. The 3D printing device selectively cures the printed composition according to a set of computerized design instructions in Step 120 to create a green body representing the desired article. Once the initial curing process in complete, the temporary solvent is removed from the cured article in Step 130 via heating, solvent extraction, or other methods for removing solvent known in the art. Following the solvent removal processes of Step 130, the green body is subjected to additional curing to polymerize remaining uncured polymerizable components in the green body in Step 140.

Methods of printing a three dimensional article or object described herein can include forming the article from a plurality of layers of a printable composition described herein in a layer-by-layer manner. Further, the layers of a build material composition can be deposited according to an image of the three dimensional article in a computer readable format. In some or all embodiments, the printable composition is deposited according to preselected computer aided design (CAD) parameters.

Additionally, it is to be understood that methods of printing a 3D article described herein can include so-called "inkjet" or "stereolithography/vat polymerization" 3D printing methods. For example, in some implementations, an inkjet printing method of printing a 3D article comprises selectively depositing layers of a printable composition described herein in a fluid state onto a substrate, such as a build pad of a 3D printing system. Each of these fabrication techniques will be described in greater detail below. Other techniques for three-dimensional manufacturing are known, and may be suitably adapted to use in the applications described herein. More generally, three-dimensional fabrication techniques continue to become available. All such techniques may be adapted to use with printable compositions described herein, provided they offer compatible fabrication viscosities and resolutions for the specified article properties. Fabrication may be performed using any of the fabrication technologies described herein, either alone or in various combinations, using data representing a three-dimensional object, which may be reformatted or otherwise adapted as necessary for a particular printing or other fabrication technology.

It is entirely possible to form a 3D article from a printable composition described herein using stereolithography (e.g., vat polymerization). For example, in some cases, a method of printing a 3D article comprises retaining a printable composition described herein in a fluid state in a container and selectively applying energy to the printable composition in the container to solidify at least a portion of a fluid layer of the printable composition, thereby forming a hardened layer that defines a cross-section of the 3D article. Additionally, a method described herein can further comprise raising or lowering the hardened layer of printable composition to provide a new or second fluid layer of unhardened printable composition at the surface of the fluid in the container, followed by again selectively applying energy to the printable composition in the container to solidify at least a portion of the new or second fluid layer of the printable composition to form a second solidified layer that defines a second cross-section of the 3D article. Further, the first and second cross-sections of the 3D article can be bonded or adhered to one another in the z-direction (or build direction corresponding to the direction of raising or lowering recited above) by the application of the energy for solidifying the printable composition. Moreover, selectively applying energy to the printable composition in the container can comprise applying electromagnetic radiation, such as UV radiation, having a sufficient energy to cure the printable composition. A method described herein can also comprise planarizing a new layer of fluid printable composition provided by raising or lowering an elevator platform. Such planarization can be carried out, in some cases, by utilizing a wiper or roller or a recoater bead. Planarization corrects the thickness of one or more layers prior to curing the material by evening the dispensed material to remove excess material and create a uniformly smooth exposed or flat up-facing surface on the support platform of the printer.

It is further to be understood that the foregoing process can be repeated a selected number of times to provide the 3D article. For example, in some cases, this process can be repeated "n" number of times. Further, it is to be understood that one or more steps of a method described herein, such as a step of selectively applying energy to a layer of printable composition, can be carried out according to an image of the 3D article in a computer-readable format. Suitable stereolithography printers include the Viper Pro SLA, available from 3D Systems, Rock Hill, S.C. and the Asiga Pico Plus39, available from Asiga USA, Anaheim Hills, Calif.

Figure 2:
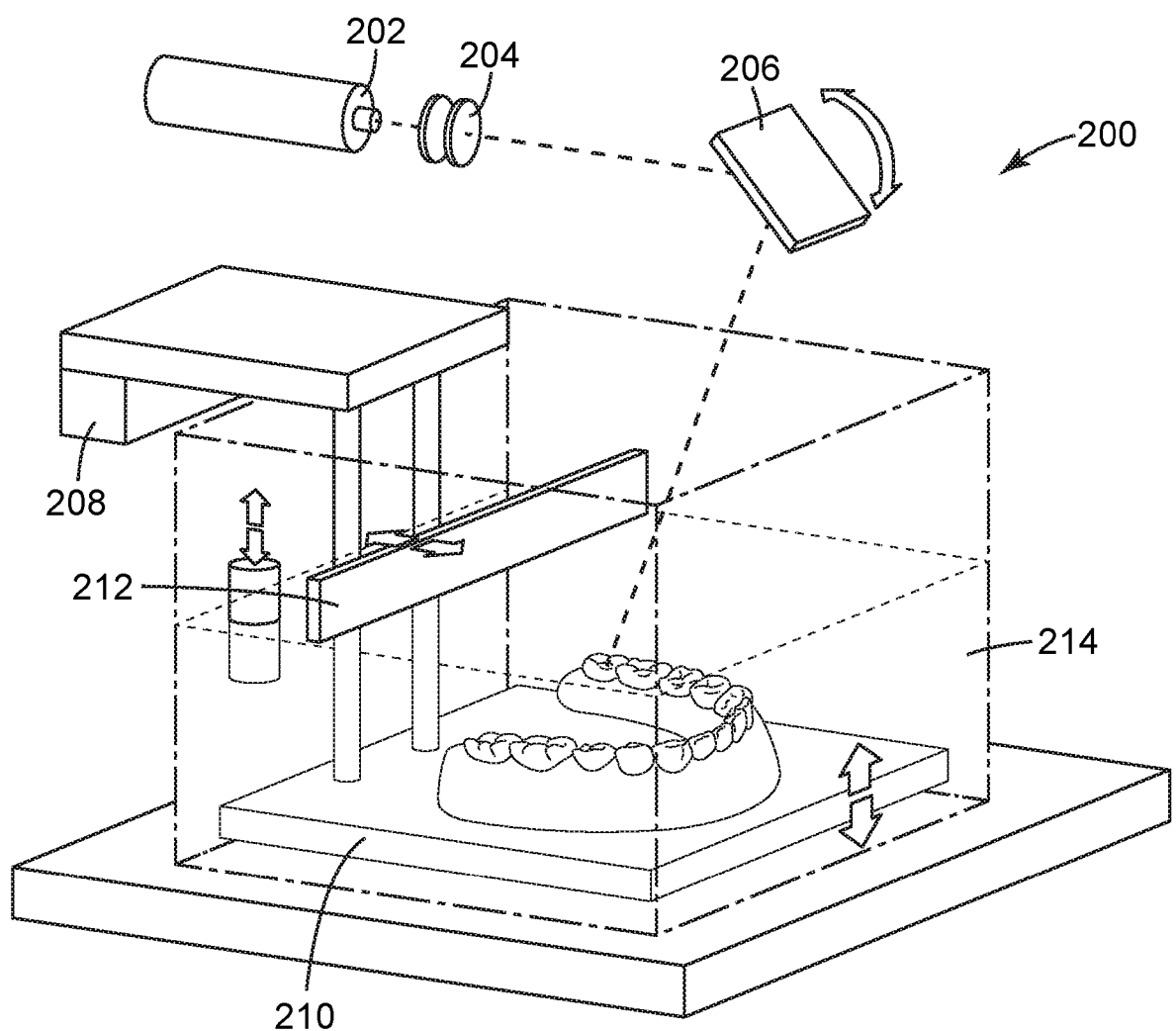
FIG. 2 is a generalized schematic of a stereolithography apparatus.

FIG. 2 shows an exemplary apparatus for vat polymerization by stereolithography ("SLA") that may be used with the printable compositions and methods described herein. In general, the SLA 200 may include a laser 202, optics 204, a steering lens 206, an elevator 208, a platform 210, and a straight edge 212, within a vat 214 filled with the printable composition. In operation, the laser 202 is steered across a surface of the printable composition to cure a cross-section of the printable composition, after which the elevator 208 slightly lowers the platform 210 and another cross section is cured. The straight edge 212 may sweep the surface of the cured composition between layers to smooth and normalize the surface prior to addition of a new layer. In other embodiments, the vat 214 may be slowly filled with liquid resin while an article is drawn, layer by layer, onto the top surface of the printable composition.

A related technology, vat polymerization with Digital Light Processing ("DLP"), also employs a container of curable polymer (e.g., printable composition). However, in a DLP based system, a two-dimensional cross section is projected onto the curable material to cure the desired section of an entire plane transverse to the projected beam at one time through the use of an array of digitally controlled micromirrors. All such curable polymer systems as may be adapted to use with the printable compositions described herein are intended to fall within the scope of the term "vat polymerization," including "stereolithography system," 3D inkjet printing, and "Digital Light Processing" as used herein.

In presently preferred implementations, the printable compositions are specifically designed or use with stereolithography systems, but those skilled in the art will contemplate that the printable compositions described herein are otherwise adaptable for use with inkjet 3D printers. As such, a preselected amount of a printable composition described herein can be heated to an appropriate temperature and jetted through the print head or a plurality of print heads of a suitable inkjet printer to form a layer of build material on a print pad in a print chamber. In some cases, each layer of build material is deposited according to the preselected CAD parameters. Suitable print heads for the deposition of build material and support material described herein are commercially available from a variety of ink jet printing apparatus manufacturers. Suitable inkjet printers, for example, include the Objet 30Pro, Objet Eden 260VS, and Objet Eden 500V, all available from Stratasys, Eden Prairie, Minn.

Additionally, in some embodiments featuring an inkjet 3D printer, a printable composition described herein remains substantially fluid upon deposition. Alternatively, in other instances, the printable composition exhibits a phase change upon deposition and/or solidifies upon deposition. Moreover, in some cases, the temperature of the printing environment can be controlled so that the jetted droplets of printable composition solidify on contact with the receiving surface. In other embodiments, the jetted droplets do not solidify on contact with the receiving surface, and remain in a substantially fluid state. Additionally, in some instances, after each layer is deposited, the deposited material is planarized and cured with electromagnetic (e.g., UV) radiation prior to the deposition of the next layer. Optionally, several layers can be deposited before planarization and curing, or multiple layers can be deposited and cured followed by one or more layers being deposited and then planarized without curing.

Figure 3:
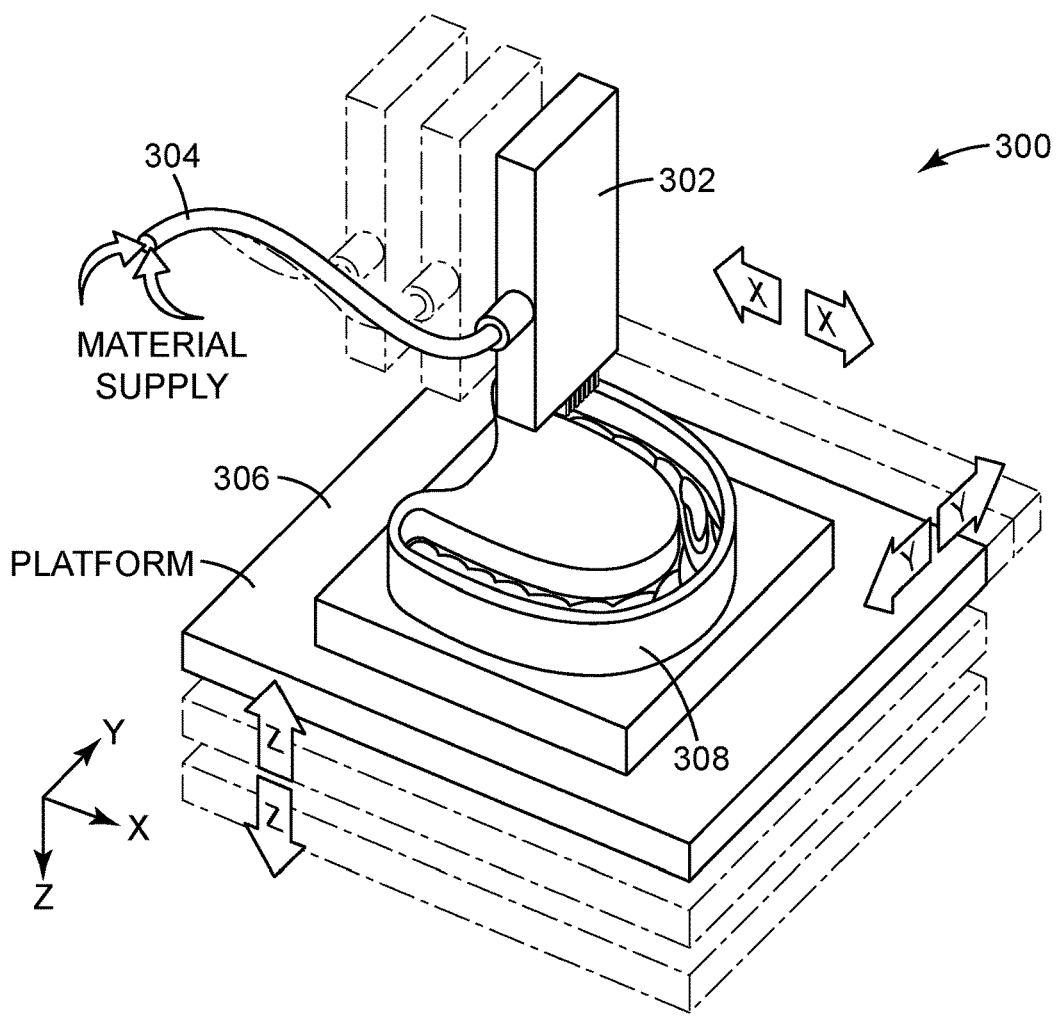
FIG. 3 is a generalized schematic of an inkjet 3D printer.

FIG. 3 shows a general schematic of an inkjet 3D printer. The 3D printer 300 may include a print head 302, a material supply 304, a platform 306, and positioning mechanisms (not shown) such as elevators, arms, belts, and the like that may be used to position the print head 302 relative to a printed item 308 during a printing operation. In operation, the print head 302 may deposit printable compositions in a layer-by-layer fashion.

A support material, when used, can be deposited in a manner consistent with that described hereinabove for the printable compositions. The support material, for example, can be deposited according to the preselected CAD parameters such that the support material is adjacent or continuous with one or more layers of the printable compositions. Jetted droplets of the support material, in some embodiments, solidify or freeze on contact with the receiving surface. In some cases, the deposited support material is also subjected to planarization.

Layered deposition of the printable composition and support material can be repeated until the 3D article has been formed. In some embodiments, a method of printing a 3D article further comprises removing the support material from the build material.

After the 3D article has been formed, it is typically removed from the 3D printing apparatus and rinsed, (e.g., an ultrasonic, or bubbling, or spray rinse in a solvent (which may be the same as or different from the temporary solvent in the printable composition) which would dissolve a portion of the uncured printable composition but not the cured, solid state green body. Any other conventional method for cleaning the article and removing uncured material at the article surface may also be utilized. At this stage, the three-dimensional article typically has sufficient green strength for handling in the remaining steps of method 100.

Turning back to FIG. 1, the temporary solvent is substantially removed from the green body in Step 130. In presently preferred implementations, the removal of the temporary solvent occurs prior to any postcure processing in Step 140. Alternatively, the temporary solvent may be removed after or during postcure. Any known means for solvent removal can be used. The green body can be subjected, for example, to at least one of oven drying, vacuum pressurization, and solvent exchange. The temporary solvent may be removed from the green body using heat sources such as a hot air gun, hot plate, steam, conventional oven, infrared heater, radiofrequency (RF) sources or microwave sources. In some embodiments, the cured article is heated to a temperature above room temperature, for example, about 60° C., during the solvent removal process of Step 130. However, various temperatures and times may be utilized.

In some embodiments, the solvent is removed according to an oven-drying process. For example, the article can be dried in a conventional oven at a temperature equal to at least 30° C., at least 40° C., at least 60° C., at least 70° C. The drying time is often greater than 6 hours, greater than 12 hours, greater than 24 hours or greater than 36 hours. In some or all embodiments, the temperature is gradually increased in the oven. For example, the rate of temperature increase could be in the range of about 0.5° C. to about 10° C. per minute. In presently preferred implementations, the temperature is increased in step-wise fashion, with at least 10 minutes of dwell time at a given temperature between temperature increases.

Alternatively, the appliance can be immersed in a heated bath containing a suitable inert liquid (for example, water) that will not dissolve or distort the article. Furthermore, the inert liquid will typically have a lower boiling point than the temporary solvent, so that the inert liquid can be more easily removed from the green body. In one such solvent exchange implementation of temporary solvent removal, the green body can be immersed in the liquid bath for 24 to 48 hours, at a temperature of 33° C., for example. Upon removal, the green body can be allowed to dry at room temperature (about 20-25° C.) for up to 48 hours. However, various temperatures and times may be utilized to reduce or increase the dry time, immersion time, and combinations thereof.

The above techniques for solvent removal may be combined with vacuum pressure to enhance the evaporation of the temporary solvent from the cured article. In some embodiments, the vacuum pressure applied is no greater than 500 hPa, in some embodiments no greater than 200 hPa, in some embodiments no greater than 100 hPa, and in yet other embodiments less than 20 hPa. In certain circumstances, the solvent removal may be performed at vacuum pressures of 1 hPa or lower. The rate of vacuum pressure increase is typically selected to avoid boiling of the temporary solvent in the green body, which can introduce foamed regions into the shaped article. In some or all embodiments, a substantial portion of the temporary solvent is removed from the green body. Allowing excess temporary solvent to remain in the printed article can deleteriously affect the otherwise desirable properties of the cured material, depending on the particular application and resin composition. In presently preferred implementations, at least 60 percent of the temporary solvent is removed. In other implementations, at least 80 percent, at least 90 percent, at least 95 percent, at least 98 percent, and at least 99 percent of the temporary solvent is removed from the three-dimensional article. The percent of solvent removal can be confirmed by recording the mass of the article before and after curing, as set out in the Examples below. In certain embodiments, particularly those with relatively high temporary solvent levels, some portion of the temporary solvent may be removed during the initial 3D printing process. Accordingly, the amount of temporary solvent removed during the subsequent solvent removal step will be less than expected given the concentration of solvent in the relevant printable composition.

In certain implementations, allowing an amount of temporary solvent to remain in the article can be acceptable, as this may shorten process and manufacturing times, particularly when the concentration of temporary solvent in the printable resin is low prior to printing. Furthermore, the presence of acceptable amounts of temporary solvent may result in a softer three-dimensional article, which may be advantageous in certain implementations.

Due in part to the removal of the temporary solvent, it is expected in certain embodiments of the present disclosure that the printed article obtained in Step 120 will shrink (i.e., reduce in volume) such that the dimensions of the article after Step 130 will be smaller than expected. For example, a printed article may shrink about 6-8% in volume upon solvent removal, though this will not typically result in a significant distortion in the shape of the final object. It is particularly contemplated, therefore, that dimensions in the digital representation of the eventual cured article may be scaled according to a global scale factor to compensate for this shrinkage. For example, in some embodiments, at least a portion of the digital article representation can be at least 101% of the desired size of the printed appliance, in some embodiments at least 102%, in some embodiments at least 105%, in some embodiments, at least 110%, and in some embodiments, at least 120%.

A global scale factor may be calculated for any given printable composition formulation by creating a calibration part according to Steps 210 and 220 above. The dimensions of the calibration article can be measured prior to the solvent removal of step 230 and post-cure of step 240.

In general, the three-dimensional article formed by initial 3D printing step in Step 120, as discussed above, is not fully cured, by which is meant that not all of the polymerizable material in the composition has polymerized even after rinsing and solvent removal. Some uncured polymerizable material is typically removed from the surface of the printed article during a cleaning process preceding the temporary solvent removal of Step 130. The article surface, as well as the bulk article itself, typically still retains uncured polymerizable material, suggesting further cure. Further curing can be accomplished by further irradiating with actinic radiation, heating, or both. Exposure to actinic radiation can be accomplished with any convenient radiation source, generally UV radiation, for a time ranging from about 10 to over 60 minutes. Heating is generally carried out at a temperature in the range of about 75-150 C, for a time ranging from about 10 to over 60 minutes in an inert atmosphere. So called post cure ovens, which combine UV radiation and thermal energy, are particularly well suited for use in the post cure process of Step 140. In general, postcuring improves the mechanical properties and stability of the three-dimensional article relative to the green body.

The following describes general methods for creating a clear tray aligner as printed appliance 400. However, other dental and orthodontic articles can be created using similar techniques and the printable compositions of the present disclosure. Representative examples include, but are not limited to, the removable appliances having occlusal windows described in International Application No. PCT/US2015/068054 (Raby et al.), the removable appliances with a palatal plate described in US20140/356799 (Cinader et al); and the resilient polymeric arch members described in International Application Nos. PCT/US2016/021239 and PCT/US2016/021583 (Cinader et al.); as well as US Publication No. 2008/0248442 (Cinader et al.). Moreover, the printable compositions can be used in the creation of indirect bonding trays, such as those described in International Publication No. WO2015/094842 (Paehl et al.) and US Publication No. 2011/0091832 (Kim, et al.) and other dental articles, including but not limited to, crowns, bridges, veneers, inlays, onlays, fillings, and prostheses (e.g., partial or full dentures). Other printable orthodontic appliances and devices include, but not limited to, orthodontic brackets, ccal tubes, lingual retainers, orthodontic bands, class II and class III correctors, sleep apnea devices, bite openers, buttons, cleats, and other attachment devices.

Alternatively, the printable compositions can be used in other industries, such as aerospace, animation and entertainment, architecture and art, automotive, consumer goods and packaging, education, electronics, hearing aids, sporting goods, jewelry, medical, manufacturing, etc.

As another alternative example, it is possible in this context to use the printable compositions as adhesives or as coating compositions. When the novel mixtures are employed as coating compositions, the resulting coatings on wood, paper, metal, ceramic, polymer, or other surfaces can be scratch resistant, and possess other desirable qualities depending on the application. The printable compositions described herein can be used to form a (e.g., cured) surface layer, a coated article, or a coated surface such as by applying the coating composition to a surface (e.g., of a substrate or article) and curing polymerizable components of the coating composition. Once polymerizable components present in the coating compositions have been cured, a suitable solvent (such as water in some embodiments) can be used to extract the non-reactive temporary solvent from the coated surface or cured coating composition. Accordingly, the printable compositions may be applied as coating compositions to enhance the properties of printed articles and articles fabricated by any other methods.

Fabricating an Orthodontic Appliance with the Printable Compositions

Figure 4:
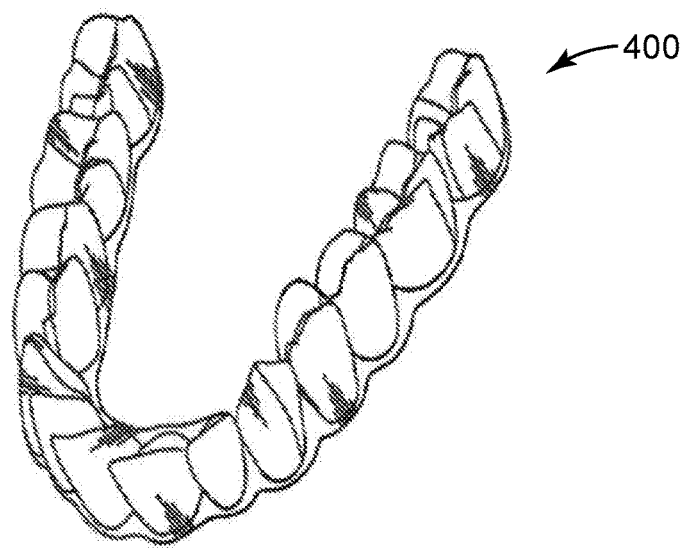
FIG. 4 is an isometric view of a 3D printed clear tray aligner, according to one embodiment of the present disclosure.

One particularly interesting implementation of a printed article is generally depicted in FIG. 4. The printed article 400 is a clear tray aligner and is removably positionable over some or all of a patient's teeth. In some embodiments, printed appliance 400 is one of a plurality of incremental adjustment appliances. The printed appliance 400 may comprise a shell having an inner cavity. The inner cavity is shaped to receive and resiliently reposition teeth from one tooth arrangement to a successive tooth arrangement. The inner cavity may include a plurality of receptacles, each of which is adapted to connect to and receive a respective tooth of the patient's dental arch. The receptacles are spaced apart from each other along the length of the cavity, although adjoining regions of adjacent receptacles can be in communication with each other. In some embodiments, the shell fits over all teeth present in the upper jaw or lower jaw. Typically, only certain one(s) of the teeth will be repositioned while others of the teeth will provide a base or anchor region for holding the dental appliance in place as it applies the resilient repositioning force against the tooth or teeth to be treated.

In order to facilitate positioning of the teeth of the patient, at least one of receptacles may be misaligned as compared to the corresponding tooth of the patient. In this manner, appliance body printed appliance 400 may be configured to apply rotational and/or translational forces to the corresponding tooth of the patient when the printed appliance 400 is worn by the patient. In some particular examples, the printed appliance 400 may be configured to provide only compressive or linear forces. In the same or different examples, the printed appliance 400 may be configured to apply translational forces to one or more of the teeth within receptacles.

In some embodiments, the shell of the printed appliance 400 fits over some or all anterior teeth present in an upper jaw or lower jaw. Typically, only certain one(s) of the teeth will be repositioned while others of the teeth will provide a base or anchor region for holding the appliance in place as it applies the resilient repositioning force against the tooth or teeth to be repositioned. A printed appliance 400 can accordingly be designed such that any receptacle is shaped to facilitate retention of the tooth in a particular position in order to maintain the current position of the tooth.

Figure 5:
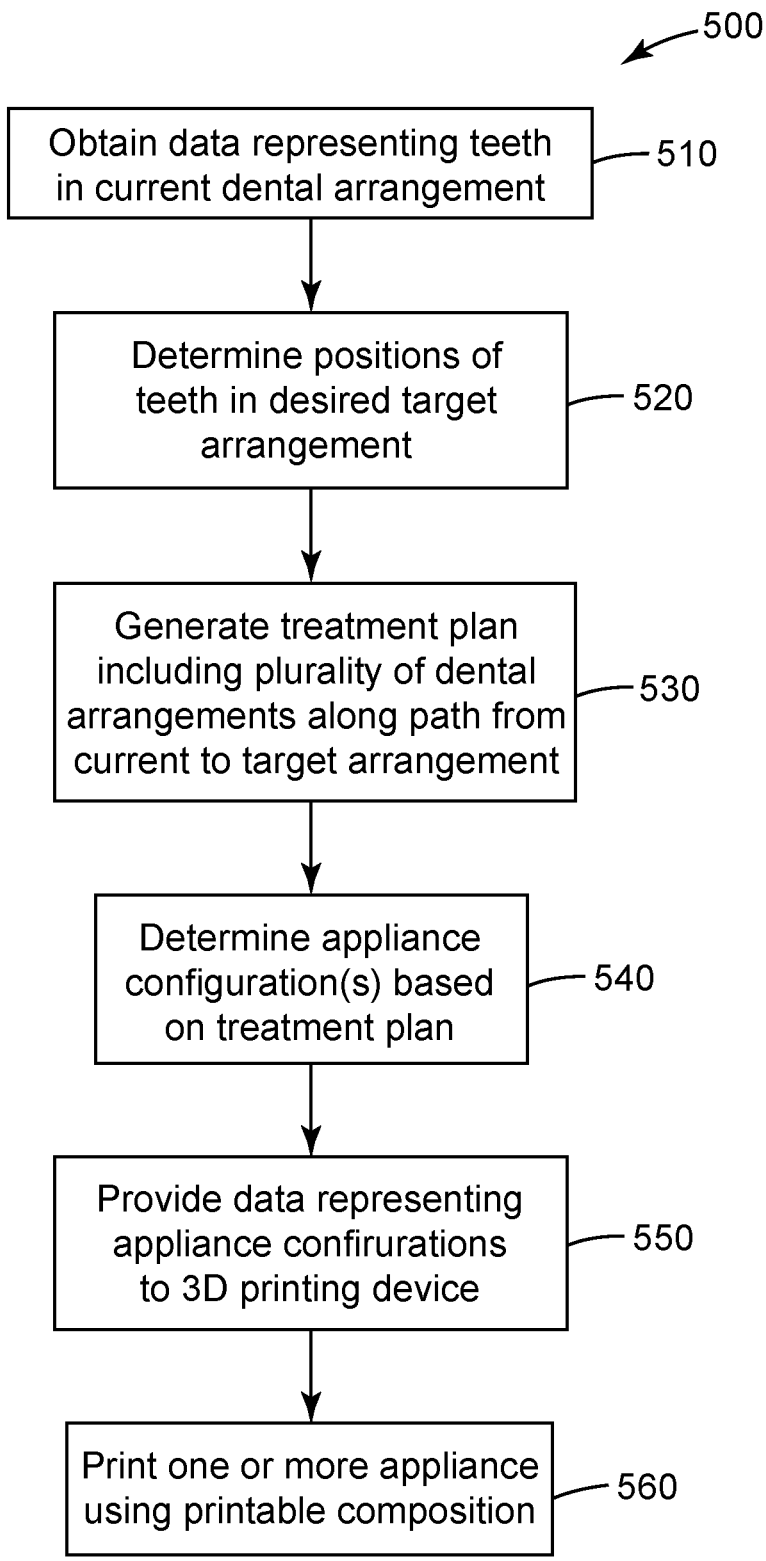
FIG. 5 is a flowchart of a process for manufacturing a 3D printed orthodontic appliance according to the present disclosure.

A method 500 of creating an orthodontic appliance using the printable compositions of the present disclosure can include general steps as outlined in FIG. 5. Individual aspects of the process are discussed in further detail below. The process includes generating a treatment plan for repositioning a patient's teeth. Briefly, a treatment plan can include obtaining data representing an initial arrangement of the patient's teeth (Step 510), which typically includes obtaining an impression or scan of the patient's teeth prior to the onset of treatment. The treatment plan will also include identifying a final or target arrangement of the patient's anterior and posterior teeth as desired (Step 520), as well as a plurality of planned successive or intermediary tooth arrangements for moving at least the anterior teeth along a treatment path from the initial arrangement toward the selected final or target arrangement (Step 530). One or more appliances can be virtually designed based on the treatment plan, (Step 540) and image data representing the appliance designs can exported in STL format, or in any other suitable computer processable format, to a 3D printing system (Step 550). An appliance can be printed using a printable composition of the present disclosure retained in the 3D printer. (Step 560)

A printed appliance such as a clear tray aligner can be designed and/or provided as a single appliance or as part of a set or plurality of appliances. Each appliance may be configured so a tooth-receiving cavity has a geometry corresponding to an intermediate or final tooth arrangement intended for the appliance. Some or all of the patient's teeth can be progressively repositioned from an initial tooth arrangement to a target tooth arrangement by modifying the geometry of the appliance (e.g., the tooth-receiving cavity geometry) over the patient's teeth. A target tooth arrangement can be a planned final tooth arrangement selected for the patient's teeth at the end of all planned orthodontic treatment. Alternatively, a target arrangement can be one of many intermediate arrangements for the patient's teeth during the course of orthodontic treatment. As such, it is understood that a target tooth arrangement can be any planned resulting arrangement for the patient's teeth that follows one or more incremental repositioning stages. Likewise, an initial tooth arrangement can be any initial arrangement for the patient's teeth that is followed by one or more incremental repositioning stages. Two or more printed appliances can be generated all at the same time or in sets or batches. The patient typically wears each appliance for a fixed length of time as instructed by their prescribing doctor. A plurality of different appliance configurations can be designed and fabricated prior to the patient wearing the appliance or any appliance of the series of appliances according to methods further specified below. Alternatively, the printed appliances can be delivered one at a time. After wearing an appliance configuration for an appropriate period of time, the patient replaces the current appliance configuration with the next appliance in the series until all the appliances in the series have been worn. Additional series of appliances may be fabricated and worn until a satisfactory treatment outcome is achieved.

Generating the Treatment Plan & Designing the Appliance

The steps of a process for defining and generating a treatment plan including printed appliances for orthodontic treatment of a patient can be implemented as computer program modules for execution on one or more computer systems. Systems and methods for generating a treatment plan can be found, for example, in U.S. Pat. No. 7,435,083 (Chisti, et al.), U.S. Pat. No. 7,134,874 (Chisti, et al.), U.S. Patent Publication Nos. 2009/0286296 (Wen, et al.); 2010/0260405 (Cinader, Jr.) and U.S. 2012/0061868 (Raby, et al.).

As an initial step, a mold or a scan of patient's teeth (and potentially mouth tissue) is acquired. This generally involves taking casts of the patient's teeth and gums, and may in addition or alternately involve taking wax bites, direct contact scanning, x-ray imaging, tomographic imaging, sonographic imaging, and other techniques for obtaining information about the position and structure of the teeth, jaws, gums and other orthodontically relevant tissue. A digital data set is derived from this data that represents an initial (e.g., pretreatment) arrangement of the patient's teeth and other tissues. A computer model of the arch may then be re-constructed based on the scan data.

One exemplary technique for acquiring at least a portion of the initial arrangement (or any subsequent arrangement) is digital scanning. A virtual dental model representing the patient's dental structure can be captured using a digital intraoral scan or by digitally scanning an impression or other physical dental model. The digital images may be provided using a hand-held intra-oral scanner such as the intra-oral scanner using active wavefront sampling developed by Brontes Technologies, Inc. (Lexington, Mass.) and described, e.g., in PCT Publication No. WO 2007/084727 (Boerjes, et al.). Scanning devices which allow for providing a virtual dental model as digital data are, for example, available under the designations Lava Scan ST and Lava™ Chairside Oral Scanner C.O.S, both from 3M Deutschland GmbH. Alternatively, other intra-oral scanners or intra-oral contact probes may be used, such as the 3M True Definition™ Scanner, available from 3M Company. In one or more embodiments, other intra-oral scanners or intra-oral contact probes may be used. As another option, the digital structure data may be provided by scanning a negative impression of the patient's teeth. As still another option, the digital structure data may be provided by imaging a positive physical model of the patient's teeth or by using a contact probe on a model of the patient's teeth. The model used for scanning may be made, for example, by casting an impression of a patient's dentition from a suitable impression material such as alginate or polyvinylsiloxane (PVS), pouring a casting material (such as orthodontic stone or epoxy resin) into the impression, and allowing the casting material to harden. Any other suitable scanning technique may be used for scanning the model or the actual dentition, including X-ray radiography, laser scanning, computed tomography (CT), magnetic resonance imaging (MRI), and ultrasound imaging. Other possible scanning methods are described, e.g., in U.S. Patent Application Publication No. 2007/0031791 (Cinader, Jr., et al.).

The initial digital data set, which may include both raw data from scanning operations and data representing surface models derived from the raw data, can be processed to segment the tissue constituents from each other including defining discrete dental objects. For example, data structures that digitally represent individual tooth crowns can be produced. In some embodiments, digital models of entire teeth are produced, including measured or extrapolated hidden surfaces and root structures.

Once the initial data set is processed, the desired positions of the anterior and posterior teeth are determined. Desired final positions of the anterior and posterior teeth (e.g., the teeth to be treated using one or more printed appliances), can be received, e.g., from a practitioner in the form of a descriptive prescription, can be calculated using orthodontic prescriptions, or can be extrapolated computationally from a clinical prescription. With a specification of the desired final positions of the teeth and a digital representation of the teeth themselves, the final position and surface geometry of each tooth can be specified to form a complete model of the teeth at the desired end of treatment or treatment stage. The result of this step is a set of digital data structures that represents a desired and/or orthodontically correct repositioning of the modeled teeth relative to presumed-stable tissue. The teeth and surrounding tissue are both represented as digital data. Further details on software and processes that may be used to derive the target dental arrangement are disclosed, e.g., in U.S. Pat. No. 6,739,870 (Lai, et al.), and U.S. Patent Application Publication Nos. 2005/0170309, 2006/0073435, 2006/0073436, 2006/0105286, and 2008/0233531 (Raby, et al.).

Having both a beginning position and a final target position for each tooth, the process next defines a treatment path or tooth path for each tooth to be received and repositioned. This includes at least defining a plurality of planned successive tooth arrangements for moving these teeth along a treatment path from an initial arrangement to a selected final arrangement.

A movement pathway for each tooth between a beginning position and a desired final position may be calculated based on a number of parameters, including the total distance of tooth movement, the difficulty in moving the teeth (e.g., based on the surrounding structures, the types and locations of teeth being moved, etc.) and other subject-specific data that may be provided. Based on this sort of information, a user or a computer program may generate an appropriate number of intermediary steps (corresponding to a number of treatment steps). In some variations, the user may specify a number of steps, and the software can map different appliance configurations accordingly. Alternatively, the movement pathway may be guided by (or set by) the user.

If the movement path requires that the teeth move more than a predetermined amount (e.g., 0.3 mm or less in X or Y translation), then the movement path may be divided up into multiple steps, where each step corresponds to a separate target arrangement. The predetermined amount is generally the amount that a printed appliance can move a tooth in a particular direction in the time required for each treatment step. For example, the steps can be defined and calculated so that each discrete position can follow by straight-line tooth movement or simple rotation from the tooth positions achieved by the preceding discrete step and so that the amount of repositioning required at each step involves an orthodontically optimal amount of force on the patient's dentition. As with other steps in the treatment plan, this calculation step can include interactions with the practitioner. Practitioner interaction can be implemented using a client process programmed to receive tooth positions and models, as well as path information from a server computer or web-based portal through which other steps of process are implemented.

In other examples, generating the treatment plan includes selecting the dimensions and shapes of the tray receptacles according to a set of predefined design constraints. The set of predesigned design constraints may include one or more factors, including, but not limited to, a maximum localized force applied to one or more of the surrounded teeth, a maximum rotational force applied to one or more of the surrounded teeth, a maximum translational force applied to one or more of the surrounded teeth, a maximum total force applied to one or more of the surrounded teeth, a maximum stress and strain translated to the periodontal ligaments of the surrounded teeth, and a maximum strain applied to the printed appliance when worn by the patient when the surrounded teeth are in their initial positions.

In the same or different examples, determining dimensions and shapes of the printed appliance can include selecting thicknesses of the shell in order to provide a stiffness suitable to reposition the one or more teeth of the patient from their initial positions to adjusted positions when the removable dental appliance is worn by the patient. Such selected thickness may range between about 0.25 millimeters and about 2.0 millimeters thick, such as between about 0.5 and about 1.0 millimeters thick. In some examples, a material can be selected for at least a portion of the shell according to the predefined design constraints or to provide a desired stiffness characteristic without necessarily increasing the thickness. The thickness of the shell is typically chosen to provide a clinically appropriate thickness of the material in the resultant appliance. The thickness of the shell should typically to be large enough such that the appliance is resilient enough to apply sufficient force to the teeth, but thin enough to be comfortably worn.

In some or all embodiments, finite element analysis (FEA) techniques may be used to analyze forces on a patient's teeth as well as the removable dental appliance during the determination of the dimensions and shapes of the removable dental appliance. For example, FEA may be used to analyze a solid model of the patient's teeth as the modeled teeth move from their initial positions to their final positions. In some or all embodiments, the treatment planning described herein may be embodied within a computer-readable storage medium, such as a computer-readable storage medium of clinician's computing device and or manufacturer's computer. The computer-readable storage medium stores computer-executable instructions that, when executed, configure a processor to perform the techniques described above. Use of FEA in appliance design is described, for example, in U.S. Pat. No. 6,739,870 (Lai, et al.).

A completed treatment plan for use in manufacturing the appliances typically includes a plurality of successive arrangements between an initial arrangement and the desired final arrangement. The plurality of successive dental arrangements may be incorporated into a single appliance or apportioned between multiple appliances to be worn in series. Accordingly, a suitable treatment plan identifies a number of removable sections, anchors, and arch members in an acceptable series, as well as a target arrangement and a commencing arrangement for each appliance in the series. A plurality of planned, successive arrangements may be stored between the target and the commencing arrangements. As defined herein, the "target arrangement" may be a desired final dental arrangement or a planned successive dental arrangement the patient should reach after treatment with the appliance. In contrast, the "commencing arrangement" is the dental arrangement the appliance is configured to represent when the appliance is first placed in the patient's mouth. As such, it is closest in orientation to the initial or current arrangement of the patient's teeth, and in some embodiments represents the current arrangement.

Digital representations of the appliances may be generated according to any one, some, or all of the plurality of arrangements (including initial and final). As one alternative, a virtual appliance configuration may be directly derived from the virtual model of teeth, using methods such as those described in US Publication No. 2011/0091832 (Kim, et al.). In one exemplar of such a method, the derivation can proceed by defining a guidance line that extends across at least a portion of the model arch in a given initial, successive, or target configuration and is spaced away from the arch and mounted anchors. For example, the guidance line follows a curved path that is generally parallel to the facial surfaces of the virtual teeth and generally lies in an occlusal plane. In one computer-assisted embodiment, the guidance lines are defined by tracing a line segment that connects the facial-most edges of the teeth as viewed from the occlusal direction, offsetting the line segment outwardly towards the facial direction by a certain distance and then applying a smoothing operation to the line segment. If desired, the certain distance can be used to define a desired appliance thickness. For instance, in some or all implementations, the creating the offsetting is approximately 0.05 mm or more from the surface of each crown The process may continue by defining a series of fitted arcs, each of which extends over the lingual, occlusal, and facial surfaces of the virtual arch model and intersects each guidance line in a generally perpendicular relationship such that each fitted arc passes over, without contacting, the virutal model.

An exterior surface of the virtual appliance shell may be formed by fitting a surface to the set of fitted arcs. Calculation of the outer appliance surface can be a specified distance offset from the inner surface and can be increased or decreased overall or at targeted locations depending on the programmed movement of individual teeth. In some embodiments, the exterior surface is an open-ended shell that completely covers the occlusal, lingual, and facial sides of the virtual model that includes the model teeth. Optionally, a surface smoothing operation is subsequently executed on the exterior surface. Then the remainder of a virtual shell is derived using the exterior surface. A solid shell may be formed by defining a composite surface that includes the exterior surface and a planar surface that extends across the cavity formed by the exterior surface. When virtually aligned with the virtual combined model, the virtual tray body surrounds the one or more teeth. The combined model of the teeth may then be virtually subtracted from the virtual transfer tray body to produce a virtual appliance precursor. Virtual appliance precursor is a digital representation of the eventually printed appliance, which in this instance will include a body having a concave shell configuration. The virtual precursor, which is preferably present in the form of a computer processable three-dimensional data file may be transmitted to a 3D printer which manufactures the physical appliance based on the virtual precursor according to manufacturing techniques described herein.

In some or all embodiments, the digital shape sampling and processing software described above may be used to analyze and compensate for material characteristics, such as shrinkage of the printed article, particularly after solvent removal. The software and processing of the digital data may also be customized to the particular manufacturing methods used by the appliance fabricator.

Manufacturing the Appliance

Each desired printed appliance configuration may be manufactured using an automated manufacturing system based on a digital model of the printed appliance produced by a computer system. The digital model may be in STL file format, though other formats suitable for use with 3D printing systems are also contemplated. In different examples, the printed appliance may be formed using 3D printing or thermo-formed and trimmed, such as trimmed with 5-axis milling or laser cutting. With 3D printing, the printed appliance may be 3D printed directly by a 3D printing system, but in other examples, the printed appliance may be thermoformed over a mold of teeth formed using 3D printing. For example, a final dental arrangement can be determined using a computer algorithm or input from a treating professional in a treatment plan as described above, and one or more intermediate dental arrangements derived by sub-dividing the treatment into a series of discrete steps can be created. In one or more embodiments, one or more of the intermediate dental arrangements can include a reduced image as is described, e.g., in U.S. Patent Publication No. 2010/0260405 (Cinader, Jr.). Once each intermediate or final dental arrangement has been derived in such fashion, respective dental models and/or appliances may be directly fabricated using the methods described above.

Manufacturing may include post-processing to, for example, remove support structures, or to assemble various components, which may also be necessary and could also be performed in a clinical setting.

Treatment Using a 3D Printed Appliance

Once received by the practitioner or the patient, a first printed appliance is installed on the arch. The first printed appliance is worn near continuously for prescribed period of time to define a first wear period. At the end of first wear period, the patient (or practitioner) removes the printed appliance from the mouth and replaces with a new printed appliance configured to move the teeth to the next successive intermediate arrangement in the patient's treatment plan.

After wearing any number of printed appliances, the patient may return to the practitioner who may evaluate the result of the first iteration of treatment. In the event that the first iteration of treatment has resulted in satisfactory final placement of the patient's teeth, the treatment may be ended. However, if the first iteration of treatment did not complete the desired movement of the patient's teeth, one or more additional iterations of treatment may be performed. To begin the next iteration or treatment, the practitioner may take another scan of the patient's teeth to facilitate the design of the ordered set of removable dental appliances. In some examples, evaluation of the result of the first iteration of treatment may include taking another scan of the patient's teeth, in which case beginning the next iteration of treatment may simply involve forwarding the digital model of the patients teeth to a manufacturing facility so that another printed appliance or series of printed appliances may be manufactured for the patient based on the new positions of the patient's teeth. In yet other examples, the newly acquired scan may be used to create one or more iterations of printed appliances in the practitioner's facility.

In one or more embodiments that utilize progressive treatment of a patient's teeth, second, third, or more intermediate scans of the teeth can be performed using any suitable technique or combination of techniques. The practitioner or manufacturer can then utilize these intermediate scans to provide one or more additional appliances that are adapted to provide one or more corrective forces to the teeth such that one or more teeth are repositioned to either a subsequent intermediate arrangement or a final target arrangement. Any suitable technique or combination of techniques can be utilized to provide these intermediate scans, models, and arch members, e.g., the techniques described in U.S. Patent Application Publication No. 2010/0260405 (Cinader, Jr.) and U.S. Provisional Patent Application Ser. No. 62/097,733 (Attorney Docket No. 75174US002).

Various techniques of this disclosure may be implemented in a wide variety of computer devices, such as servers (including the Cloud), laptop computers, desktop computers, notebook computers, tablet computers, hand-held computers, smart phones, and the like. Any components, modules or units have been described to emphasize functional aspects and does not necessarily require realization by different hardware units. The techniques described herein may also be implemented in hardware, software, firmware, or any combination thereof. Any features described as modules, units or components may be implemented together in an integrated logic device or separately as discrete but interoperable logic devices. In some cases, various features may be implemented as an integrated circuit device, such as an integrated circuit chip or chipset. Additionally, although a number of distinct modules have been described throughout this description, many of which perform unique functions, all the functions of all of the modules may be combined into a single module, or even split into further additional modules. The modules described herein are only exemplary and have been described as such for better ease of understanding.

If implemented in software, the techniques may be realized at least in part by a non-transitory computer-readable medium comprising instructions that, when executed in a processor, performs one or more of the methods described above. The computer-readable medium may comprise a tangible computer-readable storage medium and may form part of a computer program product, which may include packaging materials. The computer-readable storage medium may comprise random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The computer-readable storage medium may also comprise a non-volatile storage device, such as a hard-disk, magnetic tape, a compact disk (CD), digital versatile disk (DVD), Blu-ray disk, holographic data storage media, or other non-volatile storage device. The term "processor," as used herein may refer to any of the foregoing structure or any other structure suitable for implementation of the techniques described herein. In addition, in some aspects, the functionality described herein may be provided within dedicated software modules or hardware modules configured for performing the techniques of this disclosure. Even if implemented in software, the techniques may use hardware such as a processor to execute the software, and a memory to store the software. In any such cases, the computers described herein may define a specific machine that is capable of executing the specific functions described herein. Also, the techniques could be fully implemented in one or more circuits or logic elements, which could also be considered a processor.

EMBODIMENTS

1. A method for building a three-dimensional object, the method comprising: a) providing a printable composition comprising a high viscosity polymerizable component, a temporary solvent, and an initiator; b) selectively curing the printable composition to form an article representing the shape of the three-dimensional object; c) removing a substantial amount of the temporary solvent from the article; and d) optionally curing unpolymerized polymerizable component remaining before or after step c).
2. The method of embodiment 1, wherein the printable composition has a viscosity no greater than 15,000 cP at 25° C. 3. The method of embodiment 2, wherein the printable composition has a viscosity no greater than 10,000 cP at 25° C.
4. The method of embodiment 3, wherein printable composition has a viscosity of no greater than 5,000 cP at 25° C.
5. The method of any of the previous embodiments, wherein the temporary solvent in nonreactive in the printable composition resin.
6. The method of embodiment 5, wherein the temporary solvent constitutes 10 to 40 wt. %, based on weight of the total printable composition.
7. The method of embodiment 6, wherein the temporary solvent constitutes 15 to 30 wt. %, based on weight of the total printable composition.
8. The method of any of the previous embodiments, wherein the temporary solvent is selected from a group consisting of propylene carbonate, isopropyl alcohol, methanol, and tripropylene glycol methyl ether, and combinations thereof
9. The method of any of the previous embodiments, wherein the temporary solvent has a boiling point of at least 50° C.
10. The method of any of the previous embodiments, wherein removing a substantial amount of the temporary solvent comprises removing at least 60% of the temporary solvent 11. The method of embodiment 10, wherein removing a substantial amount of the temporary solvent comprises removing at least 90% of the temporary solvent.
12. The method of embodiment 11, wherein removing a substantial amount of the temporary solvent comprises removing at least 95% of the temporary solvent.
13. The method of any of the previous embodiments, wherein removing a substantial amount of the temporary solvent comprises heating the article at a temperature above 25° C. and below 90° C. for at least 12 hours.
14. The method of any of the previous embodiments, wherein removing a substantial amount of the temporary solvent comprises immersing the article in water for at least 12 hours; removing the article from the water; and allowing the article to dry at ambient temperature.
15. The method of any of the previous embodiments, wherein the high viscosity polymerizable component has a viscosity of at least 20,000 cP at 25° C. before mixing with the temporary solvent.
16. The method of embodiment 15, wherein the high viscosity polymerizable component has a viscosity of at least 30,000 cP and no greater than 300,000 at 25° C. before mixing with the temporary solvent.
17. The method of any of the previous embodiments, wherein the high viscosity polymerizable component comprises a poly(meth)acrylate.
18. The method of embodiment 17, wherein the high viscosity polymerizable component comprises one or more multi-functional urethane (meth)acrylates.
19. The method of any of the previous embodiments, wherein the high viscosity polymerizable component constitutes 45 to 95 wt. % of the printable composition, based on weight of the total printable composition.
20. The method of any of the previous embodiments, wherein the printable composition further comprises a polymerization inhibitor and an absorption modifier.
21. A printable composition useful for additive manufacturing, the composition comprising:
    (a) 45-95 wt. % polymerizable component having a viscosity of at least 20,000 cP at 25° C.;
    (b) 5-50 wt. % temporary solvent; (c) 0.1-5 wt. % photoinitiator; (d) 0.001-1 wt. % inhibitor; and optionally e) 0.01-1 wt. % absorption modifier, based on the total weight of the composition.
22. The printable composition of embodiment 21, wherein the printable composition has a viscosity no greater than 15,000 cP at 25° C.
23. The printable composition of embodiment 21 or 22, wherein the temporary solvent in nonreactive in the printable composition resin.
24. The printable any of the previous embodiments, wherein the temporary solvent constitutes 10 to 40 wt. %, based on weight of the total printable composition.
25. The method of embodiment 24, wherein the temporary solvent constitutes 15 to 30 wt. %, based on weight of the total printable composition.
26. The printable composition of any of embodiments 21-25, wherein the temporary solvent is selected from a group consisting of propylene carbonate, isopropyl alcohol, methanol, tripropylene glycol methyl ether, and combinations thereof.
27. The printable composition of any of embodiments 21-25, wherein the temporary solvent has a boiling point of at least 50° C.
28. The printable composition of any of the previous embodiments, wherein the high viscosity polymerizable component has a viscosity of at least 20,000 cP at 25° C. before mixing with the temporary solvent.
29. The printable composition embodiment 28, wherein the high viscosity polymerizable component has a viscosity of at least 30,000 cP and no greater than 300,000 at 25° C. before mixing with the temporary solvent.
30. The printable composition of any of the previous embodiments, wherein the high viscosity polymerizable component comprises a poly(meth)acrylate.
31. The printable composition of embodiment 30, wherein the high viscosity polymerizable component comprises one or more multi-functional urethane (meth)acrylates.
32. The printable composition of any of the previous embodiments, wherein the high viscosity polymerizable component constitutes 60 to 90 wt. % of the printable composition, based on weight of the total printable composition.
33. A stereolithography apparatus comprising: a vat; and a printable composition within the vat, wherein the printable composition comprises (a) 45-95 wt. % polymerizable component having a viscosity of at least 20,000 cP at 25° C.; (b) 5-50 wt. % temporary solvent; (c) 0.1-5 wt. % photoinitiator;

(d) 0.001-1 wt. % inhibitor; and optionally e) 0.01-1 wt. % absorption modifier, based on the total weight of the composition.

Examples

Objects and advantages of this disclosure are further illustrated by the following examples, but the particular materials and amounts thereof recited in these examples, as well as other conditions and details, should not be construed to unduly limit this disclosure.

Test Methods

Viscosity Test Method

The viscosity of the compositions was and can be tested according to ASTM D4287 using a CAP2000+ Viscometer, made by Brookfield AMETEK, Inc., Middleboro, Mass., USA.

Tensile Strength, Elongation and Modulus Test Method

The mechanical properties of the objects were and can be tested by printing a test specimen conforming to the tensile bar shape described in ASTM D638-10, Type V. The width W of the narrow section is nominally 3.18 mm, the length L of the narrow section is 9.53 mm. The thickness of the specimen is 1 mm. The length overall LO of the specimen was reduced from the 63.5 mm to 48 mm by shortening each grip area by 7.75 mm. This is done to accommodate the tensile bar in the available print area in the Asiga PicoPlus39 printer. The specimens are tested in a tensile tester model Insight 5SL, made by MTS Systems Corp., Eden Prairie, Minn., using a 5 kN load cell at a speed of 5.1 mm/min.

Testing of Exemplary Compositions

The materials used in the following examples are summarized in Table 1.

TABLE 1

Summary of materials.

| Material | Description | Source |
| --- | --- | --- |
| Exothane 10 | Difunctional urethane methacrylate | Esstech, Inc., Essington, PA |
| Exothane 108 | Difunctional urethane methacrylate | Esstech, Inc., Essington, PA |
| DESMA | Urethane methacrylate, cf. Example 1 on page 35 of WO 2009/006282 | 3M Company, St Paul, MN |
| SR-348 | Ethoxylated (2) bisphenol A dimethacrylate | Sartomer, Exton, PA |
| UDMA | Urethane dimethacrylate | Esstech Inc., Essington, PA |
| Procrylate | 2,2-Bis-4-(3-methacryloxypropoxy)phenyl)propane dimethacrylate, as further described in U.S. Pat. No. 8,389,599. | 3M Company, St. Paul, MN |
| BHT | 2,6 Di-tert-butyl-4-methyl-phenol | Sigma-Aldrich, St Louis, MO |
| Tinopal OB | Benzoxazole, 2,2'-(2,5-thiophenediyl)bis[5-(1,1-dimethylethyl)] | BASF Corporation, Florham Park, NJ |
| PC | Propylene carbonate (CAS no. 107-32-7) | Alfa Aesar, Ward Hill, MA |
| TPM | Tripropylene Glycol Methyl Ether | TCI America, Portland, OR |
| MOH | Methanol | VWR International LLC, Radnor, PA |
| TPO | 2,4,6-trimethylbenzoyldiphenylphosphine oxide | BASF Corporation, Florham Park, NJ |
| IPA | 2-propanol (isopropyl alcohol) | VWR International LLC, Radnor, PA |
| S/T Silica/Zirconia Clusters | Silane-treated silica-zirconia nanocluster filler, prepared generally as described in U.S. Pat. No. 6,730,156 at column 25, lines 50-63 (Preparatory Example A) and at column 25, line 64 through column 26, line 40 (Preparatory Example B) with minor modifications, including performing the silanization in 1-methoxy-2-propanol (rather than water) adjusted to a pH of ~8.8 with aqueous NH4OH (rather than to a pH of 3-3.3 with trifluoroacetic acid), and obtaining the nanocluster filler by gap drying (rather than spray drying). | 3M Company, St. Paul, MN |
| S/T 75 nm Silica | Silane-treated silica nanoparticle filler having a nominal particle size of approximately 75 nanometers, prepared generally as described in U.S. Pat. No. 6,899,948 at column 31, lines 30-40 (Filler C: Nano-sized Silica). | 3M Company, St. Paul, MN |

Unless otherwise noted, all printed Examples were printed on an Asiga PicoPlus39, a vat polymerization 3D printer available from Asiga USA, Anaheim Hills, Calif.

Examples 1-3

DESMA and Exothane 108 were heated in a water bath to 50° C. to lower the viscosity so that the resins could be handled easier. Then DESMA and Exothane 108 were weighed in a 125 g amber glass bottle in the amounts noted in Table 2. Then PC, TPO, Tinopal and BHT were added in the amounts noted in Table 2, and the bottles were closed and were put on a rolling bank mixer for one day.

Each mixture then was transferred in a build tray of the Asiga PicoPlus39 3D printer, a digital file with the print information for 8 tensile bars was loaded in the Asiga printer control software. A layer height of 50 micron and an exposure time of 3 seconds were selected in the design software. Then the print process was started and performed according to the general printer instructions. After the print was finished, the tensile bars were removed and washed with IPA.

| Composition of Examples 1-3 | | | |
|---|---|---|---|
| Components | Ex. 1<br>100 g | Ex. 2<br>100 g | Ex. 3<br>100 g |
| DESMA | 6.0 | 7.0 | 8.0 |
| Exothane 108 | 54.0 | 63.0 | 72.0 |
| PC | 40.0 | 30.0 | 20.0 |
| TPO | 1.00 | 1.00 | 4.0 |
| Tinopal | 0.10 | 0.10 | 0.10 |
| BHT | 0.10 | 0.10 | 0.10 |
| Total Wt. | 101.20 | 101.20 | 101.20 |

Observations:
Example 1 did not hold together and did not form a printed object.
The mixtures of Examples 2 and 3 both were printable and formed tensile bars.

Examples 4-8

Additional tensile bars were printed using the method described above, having the composition of Example 2. These tensile bars then were subjected to various solvent removal methods and the mechanical properties subsequently tested. The results and solvent removal parameters are reported below in Table 3.

TABLE 3

| Manufacturing Parameters and Mechanical Properties of Examples 4-8 | | | | | |
|---|---|---|---|---|---|
|  | Ex. 4 | Ex. 5 | Ex. 6 | Ex. 7 | Ex. 8 |
| Solvent Removal Parameters | Immersed in H2O for 48 hrs | Immersed in H2O for 96 hrs | Immersed in H2O for 2 weeks | Immersed in H2O for 48 hrs | None |
| Test Conditions | Wet | wet | wet | Dry (3 day dry at RTP) | dry |
| Elongation at break (%) | 135.0 | 109.9 | 114.3 | 102.6 | 97.5 |
| Ultimate Tensile Strength (MPa) | 4.6 | 5.2 | 5.2 | 9.4 | 7.4 |
| Modulus (MPa) | 5.6 | 6.4 | 6.5 | 16.1 | 19.4 |

Example 9

An additional sample was prepared and processed according to the solvent removal parameters of Example 7 and then re-immersed in water to explore the extent and effect, if any, of water absorption. The dried article was immersed in water for 48 hours at ambient temperature and pressure. The mechanical properties were tested on an undried article, with the results reported below in Table 4.

TABLE 4

| Mechanical Properties of Example 9 - Post Immersion | |
|---|---|
|  | Ex. 9 |
| Elongation at break (%) | 112.1 |
| Ultimate Tensile Strength (MPa) | 4.8 |
| Modulus (MPa) | 5.4 |

Examples 10-12

A mixture of high viscosity urethane methacrylates was diluted with 3 different solvents to measure the viscosity. DESMA and Exothane 10 were heated in a water bath to 50° C. to lower the viscosity so that the resins could be handled easier. Then 8.0 g of DESMA and 72.0 g of Exothane 10 were weighed in a 125 g amber glass bottle. Then 20.0 g of the solvent, the TPO, Tinopal and BHT were added, and the bottles were closed and were put on a rolling bank mixer for 2 days.

The viscosity was measured using the CAP 2000+ viscometer, using the spindle #1. The temperature was set to 22° C. and the machine was allowed to equilibrate for 10 min. The run time was set to 30 seconds, followed by a hold time of 10 seconds. Approximately 0.1 ml of resin were added to the spindle for each test. The RPM was selected so that the measurement was within 20% to 80% of the measurement range. The test was run twice on each composition, and the average of both measurements was reported.

Composition and Viscosity of Examples 10-12

| Components | Ex. 10 100 g | Ex. 11 100 g | Ex. 12 100 g |
|---|---|---|---|
| DESMA | 8.0 | 8.0 | 8.0 |
| Exothane 10 | 72.0 | 72.0 | 72.0 |
| PC | 20.0 | 0 | 0 |
| TPM | 0 | 20.0 | 0 |
| Methanol | 0 | 0 | 20.0 |
| TPO | 1.0 | 1.0 | 1.0 |
| Tinopal | 0.10 | 0.10 | 0.10 |
| BHT | 0.10 | 0.10 | 0.10 |
| Total Wt. | 101.20 | 101.20 | 101.20 |
| Temperature ° C. | 22.0 | 22.0 | 22.0 |
| Spindle RPM | 10 | 10 | 50 |
| Viscosity Pa * s | 11.47 | 14.22 | 0.451 |

Examples 13-15

A mixture of high viscosity urethane methacrylates was diluted with 3 different amounts of propylene carbonate to measure the solvent removal in an oven and the resulting tensile properties. DESMA and Exothane 10 were heated in a water bath to 50 degree Celsius to lower the viscosity so that the resins could be handled easier. Then of DESMA and of Exothane 10, in the amounts shown in table were weighed in a 125 g amber glass bottle. Then the propylene carbonate, the TPO, Tinopal and BHT were added, and the bottles were closed and were put on a rolling bank mixer for 2 days. The compositions for each of samples 13-15 are set out in Table 6 below.

TABLE 6

Composition of Examples 13-15

| Components | Ex. 13 100 g | Ex. 14 100 g | Ex. 15 100 g |
|---|---|---|---|
| DESMA | 8.0 | 7.5 | 7.0 |
| Exothane 10 | 72.0 | 67.5 | 63.0 |
| PC | 20.0 | 25.0 | 30.0 |
| TPO | 1.0 | 1.0 | 1.0 |
| Tinopal | 0.10 | 0.10 | 0.10 |
| BHT | 0.10 | 0.10 | 0.10 |
| Total Wt. | 101.20 | 101.20 | 101.20 |

Then tensile bars (i.e., the Type V sample geometry) were printed using the printable compositions of Examples 13-15. These tensile bars were cleaned with IPA, allowed to air dry for 10 min and weighed. The tensile bars then were placed in an oven at 60° C. for 2 days, then the temperature was increased to 90° C. and the tensile bars remained at that temperature for 28 days. The tensile bars then were removed, weighed, and tensile tested. The results are reproduced in Table 7 below.

TABLE 7

Solvent Removal & Mechanical Properties of Examples 13-15

| | Ex. 13 | Ex. 14 | Ex. 15 |
|---|---|---|---|
| Initial weight in g | 1.25660 | 1.21676 | 1.19903 |
| Weight after 48 hrs in g | 1.13868 | 1.10881 | 1.05749 |
| Weight after 720 hrs in g | 1.04091 | 1.00719 | 0.96358 |
| Weight loss % | 17.16 | 17.22 | 19.63 |
| Tensile Strength (MPa) | 33.2 | 32.8 | 28.1 |
| Modulus (MPa) | 355.0 | 372.2 | 293.5 |
| Elongation at Break (%) | 29.1 | 36.1 | 66.8 |

TABLE 8

Composition of Examples 16-17

| | Ex. 16 | Ex. 17 |
|---|---|---|
| Components | 100 g | 100 g |
| SR-348 | 14 | 12.6 |
| UDMA | 14 | 12.6 |
| Procrylate | 12 | 10.8 |
| S/T Silica/Zirconia Clusters | 50 | 45 |
| S/T 75 nm Silica | 10 | 9 |
| Propylene carbonate | 0 | 10 |
| TPO | 1 | 1 |
| Tinopal OB | 0.1 | 0.1 |
| BHT | 0.1 | 0.1 |
| Total Wt. | 101.20 | 101.20 |
| Temperature ° C. | 22 | 22 |
| Spindle RPM | 10 | 10 |
| Viscosity Pa * S | 26.25 | 1.73 |

Examples 16-17

Filled resins (i.e., printing compositions) were prepared according to the formulations listed in Table 8, by mixing the resin and filler components in a Thinky (Laguna Hills, Calif.) planetary mixer at 2000 rpm for one minute. Mixing was repeated 4 times, while allowing the printing composition to cool to room temperature between mixing cycles. The viscosity of Ex-16 was too high to be printable at room temperature using vat polymerization. Ex-17 was printed and tested using the method listed below.

Printing and Measurement of Mechanical Properties.

The filled resin described in Ex. 17 was printed on the Asiga Pico 2 printer with a LED light source of 385 nm and –23 mW/cm² of power. Flexural test bars according to ISO-4049 (2×2×25 mm) were printed with the 2×2 face on the build plate. The following settings were used: Slice thickness=50 μm, Burn-In Layers=3, Separation Velocity=10 mm/s, Slides per Layer=1, Burn-In Exposure Time=15.0 s, Normal Exposure Time=1.5 s. The test bars were then cleaned with Isopropyl alcohol and were then post-cured under fusion lamps for 90 mins on each side. The samples were then dried in an vacuum oven for 48 hours at 100 C. 10% of weight loss was observed after drying in the oven. The post-cured test bars were then tested in a 3-point bend fixture according to ISO-4049. The flexural strength of post-cured test bars is reported in Table 9 in megapascals (MPa).

| Example | Flexural Strength (Std. Dev.) |
|---|---|
| Ex-17 | 41.61 (5.64) |

All of the patents and patent applications mentioned above are hereby expressly incorporated by reference. The embodiments described above are illustrative of the present invention and other constructions are also possible. Accordingly, the present invention should not be deemed limited to the embodiments described in detail above and shown in the accompanying drawings, but instead only by a fair scope of the claims that follow along with their equivalents.

The invention claimed is:

1. A method for building a three-dimensional object, the method comprising:
   a) providing a printable composition comprising 45 to 95 wt. % of a high viscosity polymerizable component, 10 to 40 wt. % of a temporary solvent, and 0.1 to 5 wt. % of an initiator, based on the total weight of the printable composition, wherein the high viscosity polymerizable component has a viscosity of at least 20,000 cP at 25° C. before mixing with the temporary solvent;
   b) selectively curing the printable composition in a layer-by-layer manner to form an article from a plurality of layers of the printable composition, the article representing the shape of the three-dimensional object;
   c) removing a substantial amount of the temporary solvent from the article;
   and d) optionally curing unpolymerized polymerizable component remaining before or after step c).

2. The method of claim 1, wherein the printable composition has a viscosity no greater than 15,000 cP at 25° C., no greater than 10,000 cP at 25° C., or no greater than 5,000 cP at 25° C.

3. The method of claim 1, wherein the temporary solvent is nonreactive in the printable composition resin and constitutes 10 to 110 wt. %, based on weight of the total printable composition or 15 to 30 wt. %, based on weight of the total printable composition.

4. The method of claim 1, wherein removing a substantial amount of the temporary solvent comprises removing at least 60% of the temporary solvent, at least 90% of the temporary solvent, or at least 95% of the temporary solvent.

5. The method of claim 1, wherein removing a substantial amount of the temporary solvent comprises heating the article at a temperature above 25° C. and below 90° C. for at least 12 hours.

6. The method of claim 1, wherein removing a substantial amount of the temporary solvent comprises immersing the article in water for at least 12 hours; removing the article from the water; and allowing the article to dry at ambient temperature.

7. The method of claim 1, wherein the high viscosity polymerizable component has a viscosity of at least 30,000 cP and no greater than 300,000 cP at 25° C. before mixing with the temporary solvent.

8. The method of claim 1, wherein the high viscosity polymerizable component comprises a poly(meth)acrylate.

9. The method of claim 8, wherein the high viscosity polymerizable component comprises one or more multi-functional urethane (meth)acrylates.

* * * * *

UNITED STATES PATENT AND TRADEMARK OFFICE
CERTIFICATE OF CORRECTION

| | | |
|---|---|---|
| PATENT NO. | : 11,650,498 B2 | Page 1 of 1 |
| APPLICATION NO. | : 16/309533 | |
| DATED | : May 16, 2023 | |
| INVENTOR(S) | : Daniel Jaastad Skamser et al. | |

It is certified that error appears in the above-identified patent and that said Letters Patent is hereby corrected as shown below:

In the Claims

<u>Column 34,</u>
Line 1, Claim 3 delete "10 to 110 wt.%, based on weight of the total printable composition or", therefore.

Signed and Sealed this
Thirty-first Day of October, 2023

Katherine Kelly Vidal
*Director of the United States Patent and Trademark Office*